US010707175B2

(12) United States Patent
Zhao et al.

(10) Patent No.: US 10,707,175 B2
(45) Date of Patent: Jul. 7, 2020

(54) ASYMMETRIC OVERLAY MARK FOR OVERLAY MEASUREMENT

(71) Applicant: GLOBALFOUNDRIES Inc., Grand Cayman (KY)

(72) Inventors: Wei Zhao, Fort Lee, NJ (US); Minghao Tang, Ballston Court, NY (US); Rui Chen, Clifton Park, NY (US); Dongyue Yang, Lawrenceville, NJ (US); Haiting Wang, Clifton Park, NY (US); Erik Geiss, Mechanicville, NY (US); Scott Beasor, Greenwich, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 247 days.

(21) Appl. No.: 15/985,838

(22) Filed: May 22, 2018

(65) Prior Publication Data

US 2019/0363053 A1 Nov. 28, 2019

(51) Int. Cl.
*H01L 23/544* (2006.01)

(52) U.S. Cl.
CPC .. *H01L 23/544* (2013.01); *H01L 2223/54426* (2013.01)

(58) Field of Classification Search
CPC ............... H01L 23/544; H01L 2223/54426
USPC ............................................................ 716/51
See application file for complete search history.

(56) References Cited

U.S. PATENT DOCUMENTS

| 7,629,697 | B2 | 12/2009 | Van Haren et al. |
| 7,667,842 | B2 | 2/2010 | Schulz |
| 8,107,079 | B2 | 1/2012 | Ausschnitt et al. |
| 8,345,243 | B2 | 1/2013 | Ghinovker et al. |
| 8,361,683 | B2 | 1/2013 | Ausschnitt et al. |
| 9,506,965 | B2* | 11/2016 | Huang ............... G01R 27/2605 |
| 2004/0169861 | A1* | 9/2004 | Mieher ............... G01N 21/956 |
| | | | 356/400 |
| 2008/0217794 | A1 | 9/2008 | Smith et al. |
| 2009/0127723 | A1* | 5/2009 | Zhang ................ G03F 7/70633 |
| | | | 257/797 |
| 2011/0248388 | A1 | 10/2011 | Ausschnitt et al. |
| 2012/0033215 | A1 | 2/2012 | Kandel et al. |
| 2013/0293890 | A1* | 11/2013 | Amir ..................... G01B 11/14 |
| | | | 356/401 |
| 2015/0153268 | A1 | 6/2015 | Amir |

(Continued)

OTHER PUBLICATIONS

Adel et al., "Optimized Overlay Metrology Marks: Theory and Experiment," IEEE Transactions on Semiconductor Manufacturing, 17:166-79, May 2004.

(Continued)

*Primary Examiner* — Suresh Memula
(74) *Attorney, Agent, or Firm* — Amerson Law Firm, PLLC

(57) ABSTRACT

One illustrative example of an overlay mark disclosed herein includes four quadrants (I-IV). Each quadrant of the mark contains an inner periodic structure and an outer periodic structure. Each of the outer periodic structures includes a plurality of outer features. Each of the inner periodic structures includes a plurality of first inner groups, each of the first inner groups having a plurality of first inner features, each first inner group being oriented such that there is an end-to-end spacing relationship between each first inner group and a selected one of the outer features.

19 Claims, 18 Drawing Sheets

(56) References Cited

U.S. PATENT DOCUMENTS

| | | | |
|---|---|---|---|
| 2015/0268164 A1 | 9/2015 | Amir | |
| 2015/0323471 A1* | 11/2015 | Sapiens | G01N 21/93 |
| | | | 356/73 |
| 2016/0047744 A1* | 2/2016 | Adel | G03F 7/70633 |
| | | | 356/401 |
| 2016/0313652 A1* | 10/2016 | Liou | G03F 7/70633 |
| 2017/0052458 A1 | 2/2017 | Tang | |
| 2018/0129774 A1* | 5/2018 | Greco | G03F 7/70633 |

OTHER PUBLICATIONS

Megged et al., "EUV Lithography and Overlay Control," YMS Magazine, Dec. 2017.
Schulz et al., "Meeting overlay requirements for future technology nodes with in-die overlay metrology,".
RF Filter Technology for Dummies, Quorvo Special Edition, John Wiley & Sons, Inc., 2015.

\* cited by examiner

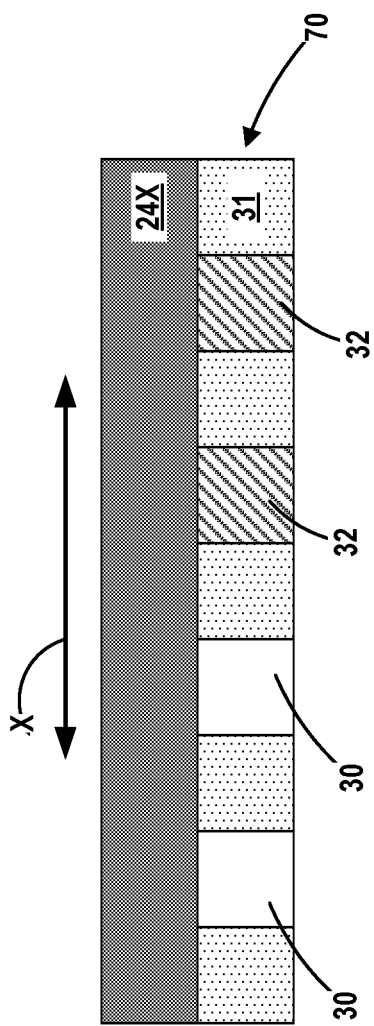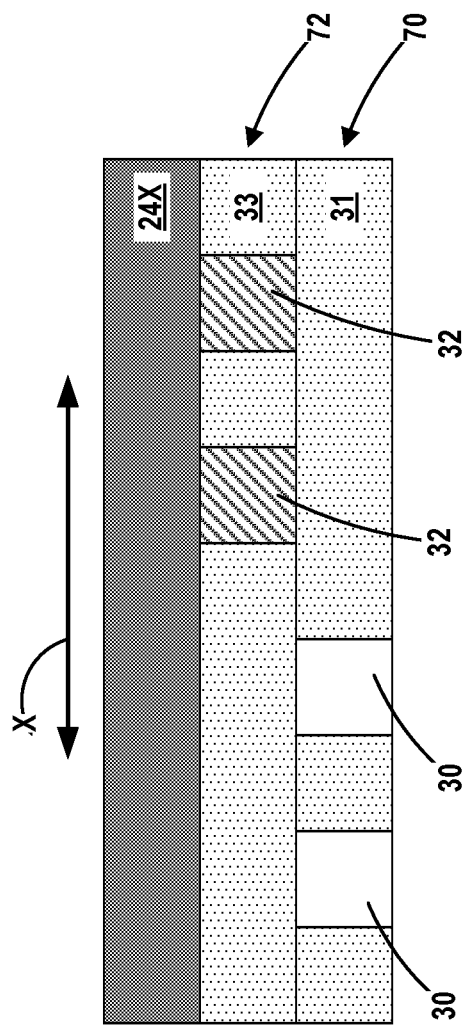

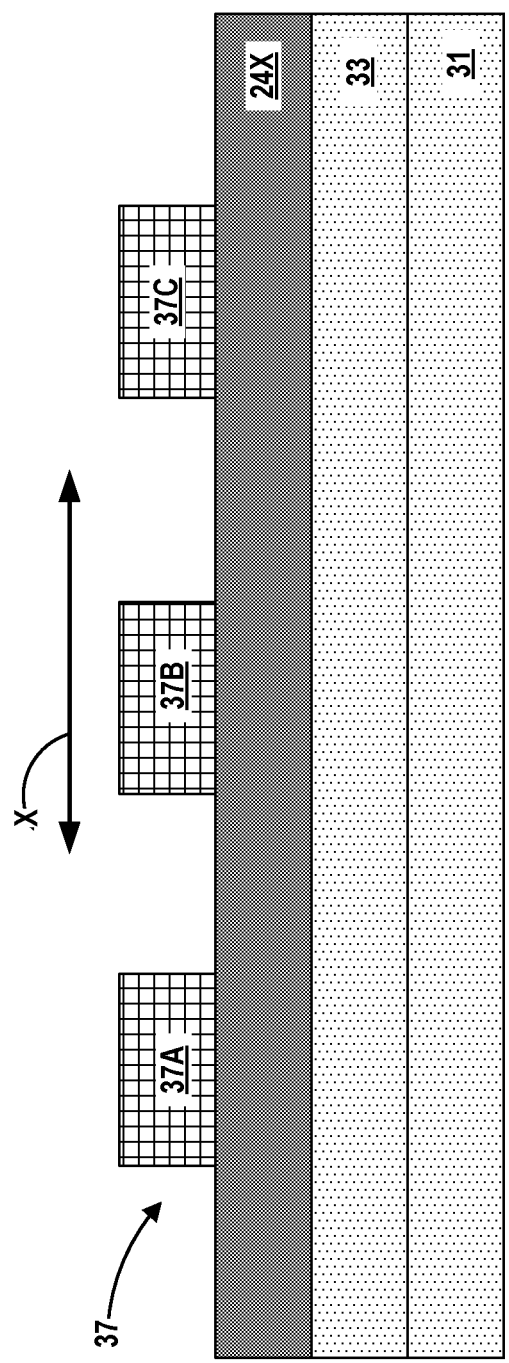

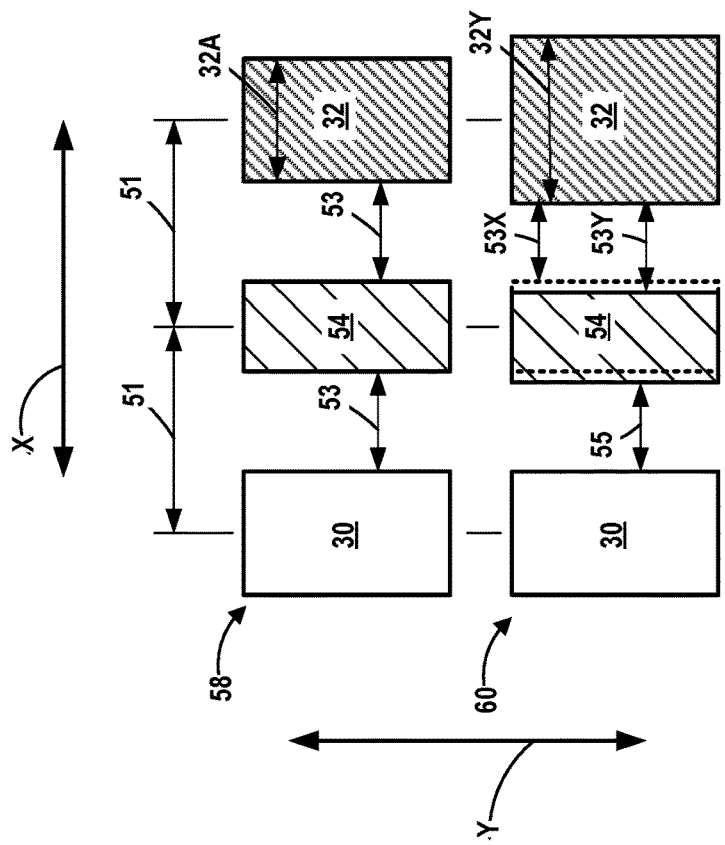
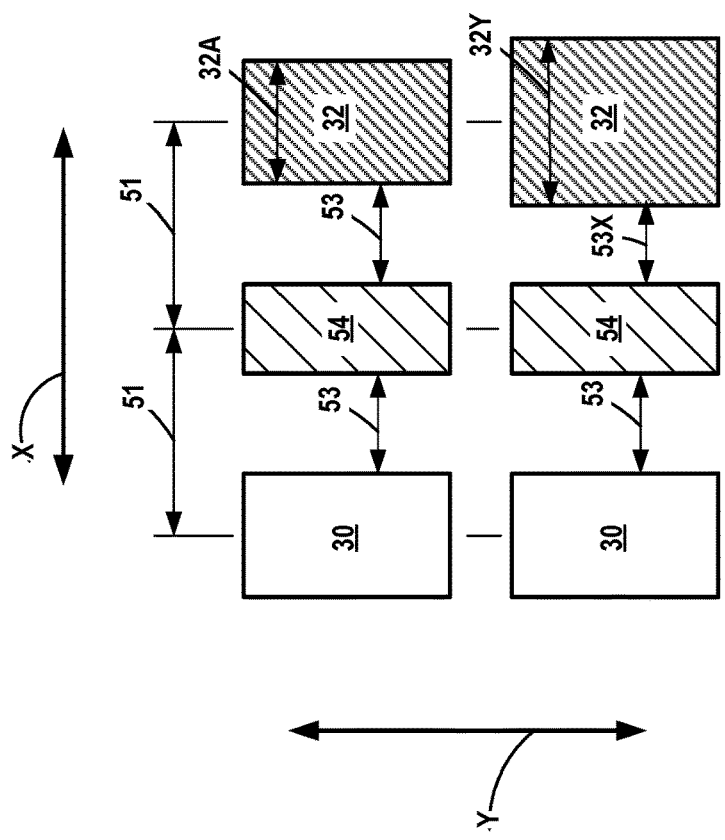

ASYMMETRIC OVERLAY MARK FOR OVERLAY MEASUREMENT

BACKGROUND OF THE DISCLOSURE

1. Field of the Disclosure

The present disclosure generally relates to the fabrication of semiconductor devices, and, more particularly, to various embodiments of an asymmetric overlay mark for overlay measurement that may be used when, for example, manufacturing integrated circuit products.

2. Description of the Related Art

One of the key parameters in the fabrication of integrated circuit (IC) products involves accurate overlay positioning—the accuracy of aligning pattern features in a current layer to previously-patterned features in a previously formed layer. Overlay is traditionally measured with relatively large test structures which are located in the scribe lines located between production die formed on a semiconductor wafer. At a very high level, IC products are manufactured by forming a plurality of patterned layers of material—one above another—wherein each of the patterned layers of material includes a plurality of features, e.g., STI (Shallow Trench Isolation) regions, gate structures, device level contact structures, multiple metallization layers that include a plurality of conductive lines and vias, etc. The critical dimension, i.e., minimum feature size, of the patterned features formed in these patterned layers of material in advanced IC products has been, and is, steadily decreasing with each advancing product generation. Typically, the patterned features formed in a subsequent patterned layer of material bear a relative spatial relationship to the patterned features formed in a previously formed patterned layer of material. That is, the patterned features in a subsequently formed patterned layer of material have to be spatially aligned to the patterned features formed in a previously formed patterned layer of material within specified registration tolerances that allow for some amount of non-overlay.

FIG. 1 schematically shows a top view of an illustrative prior art symmetrical advanced imaging metrology (AIM) mark 10. The symmetrical AIM mark 10 is typically fabricated within a scribe line of any appropriate semiconductor substrate 12 bearing a plurality of production die (not shown) formed on the substrate 12. The actual integrated circuits for the IC product include various semiconductor devices, e.g., transistors, capacitors, resistors, etc., that are formed within each of the production die. The symmetrical AIM mark 10 can be described with reference to a traditional Cartesian coordinate system having a center 18, a first direction X and a second direction Y that is orthogonal to the direction X. The symmetrical AIM mark 10 includes a plurality of quadrants: I (+X, +Y), II (−X, +Y), III (−X, −Y) and IV (+X, −Y). Each of the quadrants I-IV includes a plurality of periodic structures that enables the measurement of an overlay error in at least two independent directions—the X direction and the Y direction, as indicated in FIG. 1. In this example, the AIM mark 10 includes four inner periodic structures 13 and four outer periodic structures 15. Considered collectively, the four inner periodic structures 13 are generally referred to as the "inner layer" or "previous layer", while the collection of the four outer periodic structures 15 are generally referred to as the "outer layer" or "current layer." In the depicted example, each of the inner periodic structures 13 includes six illustrative inner features 14. These six inner features 14 in each of the inner periodic structures 13 are all the same and they are, collectively, representative of a single group of structures, e.g., gate electrode structures, that were previously formed on the IC product. Each of the four outer periodic structures 15 include six illustrative outer features 16. The outer features 16 in the four outer periodic structures 15 are associated with patterned features that will be formed in the current (or outer) layer of material that is formed above the previously patterned layer of material (the inner layer). In this depicted example, the four inner periodic structures 13 and the four outer periodic structures 15 are positioned symmetrically relative to the center 18 of the symmetrical AIM mark 10. More specifically, the features 14 in the inner periodic structures 13 in quadrants II and IV are reverse mirror images of each other relative to a line passing through the center 18 of the symmetrical AIM mark 10 in the X-direction or Y-direction. Similarly, the features 14 in the inner periodic structures 13 in quadrants I and III are reverse mirror images of each other relative to a line passing through the center 18 of the symmetrical AIM mark 10 in the Y-direction or X-direction.

The present disclosure is directed to various embodiments of an asymmetric mark for overlay measurement for use in manufacturing integrated circuit products.

SUMMARY OF THE EMBODIMENTS

The following presents a simplified summary of various embodiments of the subject matter disclosed herein in order to provide a basic understanding of some aspects of the technology disclosed herein. This summary is not an exhaustive overview of the technology disclosed herein. It is not intended to identify key or critical elements of the technology disclosed herein or to delineate the scope of the subject matter disclosed herein. Its sole purpose is to present some concepts in a simplified form as a prelude to the more detailed description that is discussed later.

One illustrative example of an overlay mark disclosed herein includes four quadrants (that will be referenced with numerals I, II, III and IV respectively). The mark includes four inner periodic structures and four outer periodic structures, wherein each of the four quadrants includes one of the four inner periodic structures and one of the four outer periodic structures. Each of the outer periodic structures includes a plurality of outer features. In this illustrative embodiment, each of the inner periodic structures includes a plurality of first inner groups, each of the first inner groups having a plurality of first inner features, each first inner group being oriented such that there is an end-to-end spacing relationship between each first inner group and a selected one of the outer features.

BRIEF DESCRIPTION OF THE DRAWINGS

The disclosure may be understood by reference to the following description taken in conjunction with the accompanying drawings, in which like reference numerals identify like elements, and in which:

FIGS. 2-17, 19, and 20 are various views that depict various embodiments of various asymmetric overlay marks disclosed herein and the use of such asymmetric overlay marks.

Figure 1:
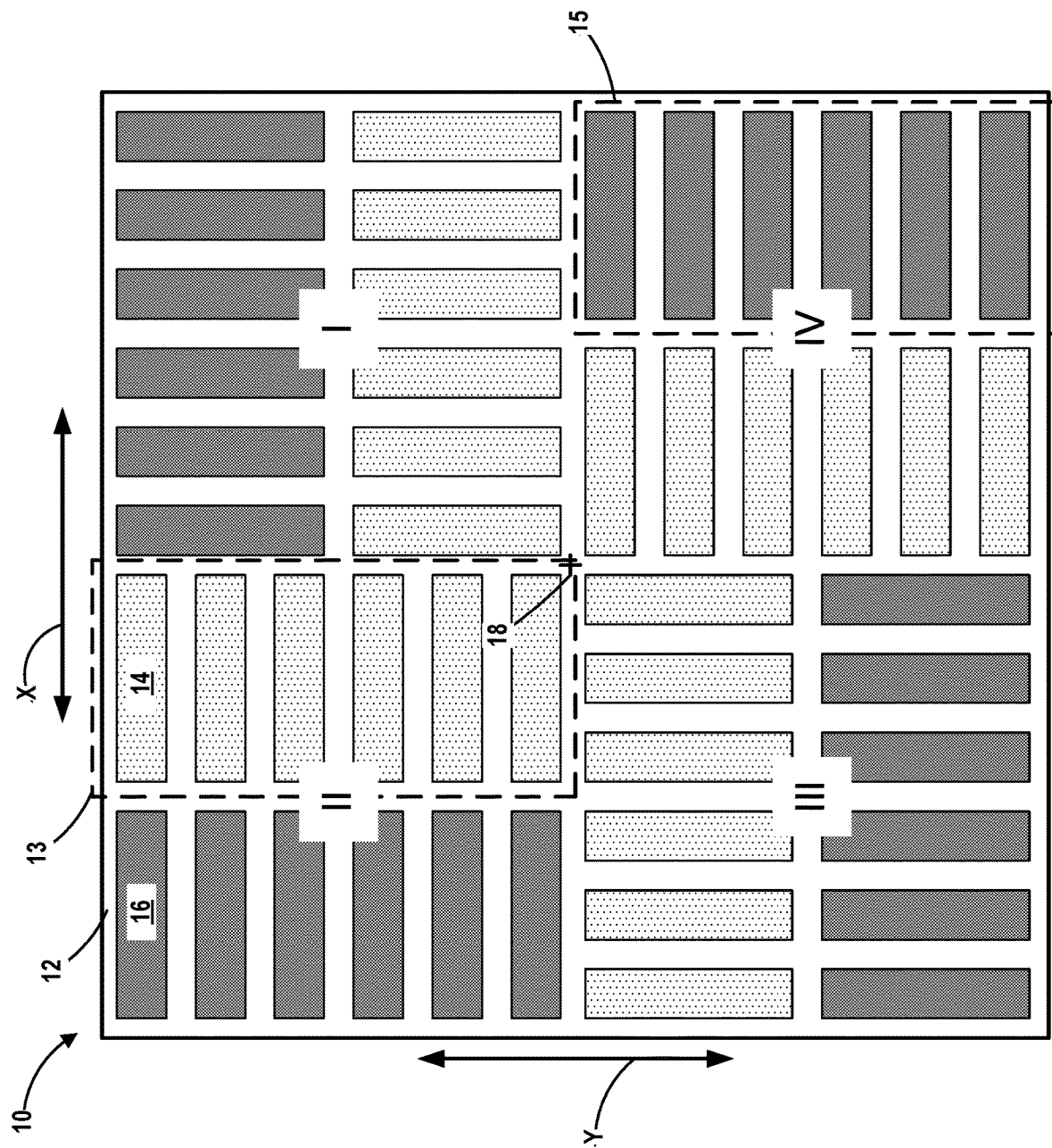
FIG. 1 is simplistic depiction of a prior art symmetric AIM (Advanced Imaging Metrology) overlay mark.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
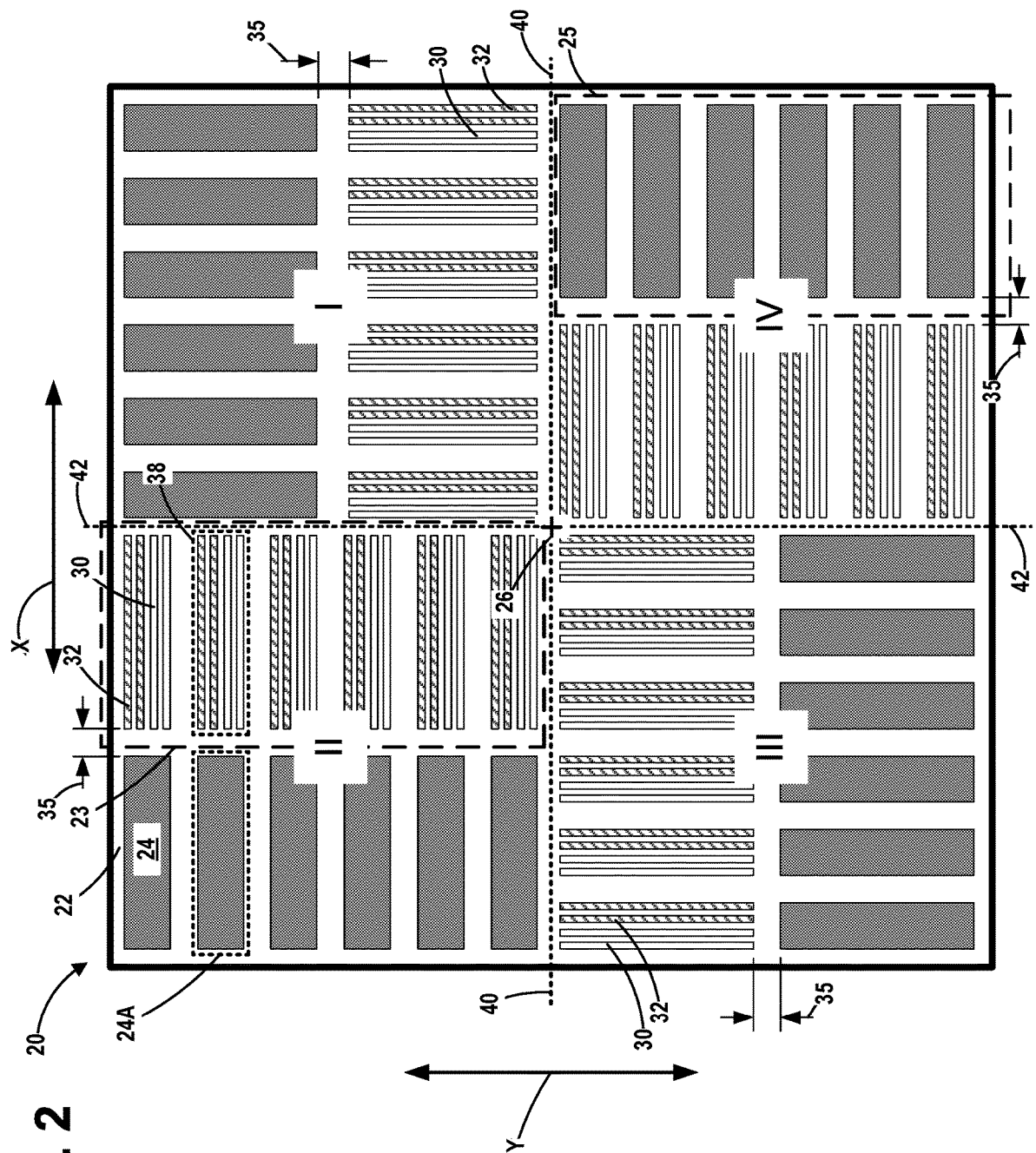

The present disclosure generally relates to various embodiments of asymmetric overlay marks that may be used for overlay measurement when, for example, manufacturing integrated circuit products, and methods of using such asymmetric overlay marks. FIG. 2 schematically shows a top view of one illustrative embodiment of an asymmetric advanced imaging metrology (AIM) mark 20 disclosed herein. As is well known, integrated circuits for an IC product include various semiconductor devices, e.g., transistors, capacitors, resistors, etc., that are formed within each of a plurality of production die (not shown) formed on a semiconductor substrate 22. The asymmetric AIM marks 20 disclosed herein may be described with reference to a traditional Cartesian coordinate system having a center 26, a first direction X and a second direction Y that is orthogonal to the direction X. The asymmetric AIM mark 20 includes a plurality of quadrants: I (+X, +Y), II (−X, +Y), III (−X, −Y) and IV (+X, −Y). The asymmetric AIM mark 20 includes a first centerline 40 (X-centerline) that extends in the X direction and a second centerline 42 (Y-centerline) that extends in the Y direction. Quadrants I and II, considered collectively, and quadrants III and IV, considered collectively, are positioned on opposite sides of the first (X) centerline 40. Quadrants I and IV, considered collectively, and quadrants II and III, considered collectively, are positioned on opposite sides of the second (Y) centerline 42.

In one illustrative example, a plurality of the asymmetric AIM marks 20 disclosed herein may be fabricated at various locations within the scribe lines of the semiconductor substrate 22 between the production die. In other embodiments, one or more of the asymmetric AIM marks 20 may be formed within one or more of the production die. In even other embodiments, the asymmetric AIM marks 20 may be formed in both the scribe lines and within the production die on a substrate.

The asymmetric AIM marks 20 disclosed herein includes a plurality of periodic structures that enables the measurement of an overlay error in at least two independent directions—the X direction and the Y direction, as indicated in FIG. 2. The X and Y directions are indicated in other drawings in the application for reference purposes. The X and Y directions are orthogonal to one another. The asymmetric AIM mark 20 includes four quadrants (I-IV). In this illustrative example, the asymmetric AIM mark 20 includes four inner periodic structures 23 and four outer periodic structures 25. One of the inner periodic structures 23 and one of the outer periodic structures 25 is formed in each of the quadrants I-IV. Considered collectively, the four inner periodic structures 23 constitute the "inner layer" or "previous layer", while the collection of the four outer periodic structures 25 constitute the "outer layer" or "current layer." Broadly described, the inner periodic structures 23 contain a plurality of inner features (described more fully below) that correspond to various production features that were previously formed on the production die. The inner features are formed at the same time as the associated production features are formed on the production die. As described more fully below, the outer periodic structures 25 contain a plurality of outer features (described more fully below) that correspond to various production features that were formed on the production die after proper alignment or overlay of a patterned etch mask (that will be used in forming the outer features) with respect to the previously formed inner features was confirmed. The outer features are formed at the same time as their associated production features are formed in the current layer on the production die.

The inner periodic structures 23 includes a plurality of different inner features 30, 32 that are formed in one or more layers of material. The inner features 30 are all the same and they are, collectively, representative of a first group of previously-formed structures, e.g., gate electrode structures that were previously formed on the IC product. The inner features 32 are all the same and they are, collectively, representative of a second group of previously-formed structures, e.g., conductive metal lines, conductive vias, etc., that were previously formed on the IC product. The inner features 30, 32 may be representative of the same types of features, e.g., conductive metal lines, where the inner features 30 are representative of such lines that were previously formed in the M1 metallization layer, while the inner features 32 are representative of conductive metal lines that were previously formed in the M2 metallization layer. Of course, as noted above, the inner features 30, 32 may represent different types of previously-formed features, e.g., the inner features 30 may be representative of previously-formed gate electrode structures while the inner features 32 may be representative of previously-formed gate contact structures, etc. The inner features 30, 32 may be formed in the same physical layer of material or they may be formed in different layers of material. The inner features 30, 32 may be formed at the same time, e.g., in the same patterning process, or they may be formed at different times.

In the example shown in FIG. 2, the asymmetric AIM mark 20 is depicted at a point in processing where the inner features 30, 32 of the inner periodic structures 23 and the outer features 24 of the outer periodic structures 25 have already been physically formed in the four quadrants I-IV of the asymmetric AIM mark 20. In practice, a layer of material (not shown)—the current layer—that is to be patterned will be formed above the entire substrate and the previously-formed inner periodic structures 23. At that point, a patterned etch mask (not shown), e.g., a patterned layer of photoresist (or the like) that includes a plurality of patterned mask features (not shown), will be formed above the current layer of material to be patterned. Next, the position of the centerline of the patterned mask features in the patterned etch mask relative to the centerlines of the previously-formed inner features 30, 32 formed in the inner periodic structures 23 will be determined, typically by visual observation. If the centerline-to-centerline spacing or overlay between patterned mask features in the patterned etch mask and the previously-formed inner features 30, 32 formed in the inner periodic structures 23 is determined to be acceptable (e.g., based upon a pre-established criteria), the current layer of material is patterned, e.g., the current layer is etched using the patterned etch mask. If the centerline-to-centerline spacing or overlay between patterned mask features in the patterned etch mask and the previously-formed inner features 30, 32 formed in the inner periodic structures 23 is determined to be unacceptable, then the initial patterned etch mask is removed. At that point, a second patterned etch mask is then formed above the current layer (that is to be patterned) and the overlay is again measured. This process is repeated until such time as the overlay, i.e., the centerline-to-centerline spacing between the patterned mask features in the latest patterned etch mask and the previously-formed inner features 30, 32 in the inner periodic structures 23, is determined to be acceptable, at which time the current layer is etched.

In the depicted example in FIG. 2, each of the inner periodic structures 23 includes a plurality of inner features, i.e., a plurality of first patterned inner features 30 and a plurality of second patterned inner features 32. Such an illustrative asymmetric AIM mark 20 may be used in a variety of processing applications, such as, for example, a process involving a double patterning process. In the illustrative example shown in FIG. 2, each of the inner periodic structures 23 includes six groups 38 of the previously-formed inner features 30, 32, wherein each group 38 includes two of the first inner features 30 and two of the second inner features 32. In other possible embodiments, each group 38 may only have one inner feature 30 and one inner feature 32. As noted above, the four inner periodic structures 23 are associated with previously-formed features in the production die that are formed in one or more previously patterned layer(s) of material. In one embodiment, the inner features 30 are all the same and they are, collectively, representative of a first group of structures that were previously formed on the IC product, while the inner features 32 are all the same and they are, collectively, representative of a second group of structures that were previously formed on the IC product. Of course, as will be appreciated by those skilled in the art after a complete reading of the present application, the novel asymmetric AIM marks 20 disclosed herein may have any desired number of the inner periodic structures 23 and outer periodic structures 25. Additionally, the inner periodic structures 23 may include any desired number of previously formed inner features, e.g., 2-7 of the patterned inner features, instead of the illustrative two illustrative inner features 30, 32 shown in FIG. 2.

With continuing reference to FIG. 2, in this illustrative example, the four outer periodic structures 25 each include six illustrative outer features 24. After it was determined that there was proper or acceptable overlay (i.e., centerline-to-centerline spacing) between the patterned mask features in the patterned etch mask and the inner features 30, 32 of the inner period structures 23 (i.e., after it was confirmed that the outer features 24 will be formed at the desired location relative to the previously-formed inner features 30, 32 in the inner layer), an etching process was performed through the properly aligned patterned etch mask on the current layer of material to thereby form the outer features 24 (in the four outer periodic structures 25) adjacent the previously-formed inner features 30, 32 of the inner period structures 23 (the inner layer(s)).

Unlike prior art symmetric overlay marks, in the asymmetric AIM marks 20 disclosed herein, the four inner periodic structures 23 are positioned asymmetrically relative to the center 26 of the asymmetric AIM mark 20. That is, the inner periodic structure 23 in quadrant IV has the same composition of the inner features 30, 32 arranged in the same relative position (in the Y-direction) as the inner periodic structure 23 in quadrant II. More specifically, with reference to the plan view shown in FIG. 2, in the inner periodic structure 23 formed in quadrant II, the inner features 30 within each group 38 are positioned closer to the X-centerline 40 than are the inner features 32 within that group 38. In contrast, in the inner periodic structure 23 formed in quadrant IV, the inner features 32 within each group 38 are positioned closer to the X-centerline 40 than are the inner features 30 within that group 38. Stated another way, when viewed as shown in FIG. 2, within each group 38, the inner features 32 are positioned above the inner features 30. Accordingly, the inner periodic structures 23 in quadrants II and IV are not mirror images of one another. That is, the inner periodic structures 23 in quadrants II and IV are positioned asymmetrically relative to the center 26 and the X-centerline 40 of the asymmetric AIM mark 20.

Similarly, the inner periodic structure 23 in quadrant I has the same relative arrangement (in the X direction) and same composition of inner features 30, 32 as the inner periodic structure 23 in quadrant III. More specifically, with reference to the plan view shown in FIG. 2, in the inner periodic structure 23 formed in quadrant I, the inner features 30 within each group 38 are positioned closer to the Y-centerline 42 than are the inner features 32 within that group 38. In contrast, in the inner periodic structure 23 formed in quadrant III, the inner features 32 within each group 38 are positioned closer to the Y-centerline 42 than are the inner features 30 within that group 38. Stated another way, when viewed as shown in FIG. 2, within each group 38, the inner features 32 are positioned to the right of the inner features 30. Accordingly, the inner periodic structures 23 in quadrants I and III are not mirror images of one another. That is, the inner periodic structures 23 in quadrants I and III are positioned asymmetrically relative to the center 26 and the Y-centerline 42 of the asymmetric AIM mark 20.

It should also be noted that there is an end-to-end spacing 35 relationship between each group 38 (of inner features) within the inner periodic structure 23 and the immediately adjacent outer features 24 formed in the adjacent outer periodic structure 25. For example, with reference to FIG. 2, in quadrant II, the group 38 within the dashed line 38 has an end-to-end spacing relationship with the outer feature 24 within the dashed line region 24A. This end-to-end (or tip-to-tip) spacing 35 is relatively the same in all four quadrants. Note that, unlike prior art symmetrical AIM marks, each group 38 includes at least two individual inner features. In the example depicted in FIG. 2, each group 38 includes four inner features—two of the inner features 30 and two of the inner features 32. Also note that, in terms of the design of the mark, the physical space (or X-Y footprint) occupied by each group 38 of inner features may be approximately the same as that of the corresponding feature 24 with which it has the end-to-end spacing 35 relationship. However, in practice, the physical space occupied by each group 38 of inner features and the physical space occupied by the corresponding outer feature 24 may vary due to process variations.

As described more fully below, this asymmetric nature of the asymmetric AIM marks 20 disclosed herein permits the measuring of overlay error for multiple features formed in multiple layers of material, e.g., 2, 3, 4, 5 or more layers.

In general, the inner features 30, 32 may be associated with various production features (not shown) that are formed in one or more patterned layer(s) of material (including the substrate 22) that were formed in the production die. The inner features 30, 32 may be representative of various types of production features formed in different layers of material or different levels of an IC product. For example, the inner features 30, 32 may be associated with the formation of production features such as gate structures, STI regions, contact structures, conductive lines and/or vias formed in various metallization layers, etc. The inner features 30 may represent a first type of structure, e.g., contact structures to source/drain regions of transistors, while the inner features 32 may represent a second type of structure that is different from the first type of structure, e.g., the inner features 32 may represent one or more conductive vias (V0) in the M1 metallization layer. In other cases, the inner features 30, 32 may be representative of the same type of structure, e.g., conductive metal lines formed in different metallization layers (at different levels above the substrate 22) on an IC product.

In general, the inner features 30, 32 in the inner periodic structures 23 are formed in the asymmetric AIM mark 20 at the same time as the production features (not shown) associated with the inner features 30, 32 are formed in the production die. However, the individual inner features 30, 32 of the inner periodic structures 23 may not be formed in accordance with the same design rules as are the associated production features that are formed in the production die, i.e., the individual inner features 30, 32 for the asymmetric AIM mark 20 may be formed to a significantly larger size as compared to the associated production features formed in the production die so as to enhance the ability to detect any offset (i.e., misalignment) between the inner and outer periodic structures 23 and 25.

Each of the quadrants includes an inner periodic structure 23 and an outer periodic structure 25. The outer features 24 in the outer periodic structure 25 in quadrants II and IV are oriented such that the long axis of the outer features 24 extends in the X-direction. The inner features 30, 32 in the inner periodic structures 23 positioned in quadrants II and IV are also oriented such that the long axis of the inner features 30, 32 extends in the X-direction. There are also spaces (in the Y-direction) between the inner features 30, 32 within each group 38 in each of the inner periodic structures 23 in quadrants II and IV. As described more fully below, for each of the inner groups 38 and its corresponding outer feature 24 with which it has an end-to-end spacing relationship, the centerline-to-centerline spacing between each of the inner features 30, 32 and the corresponding outer features 24 in quadrants II and IV determines the overlay error (if any) in the Y-direction. The centerline-to-centerline spacing between the inner features 30, 32 within each of the groups 38 and their corresponding outer features 24 in quadrants II and IV shown in FIG. 2 reflects the idealized (or perfect) overlay (in the Y-direction) between the outer features 24 in the current layer as compared to the groups 38 of inner features 30, 32 in the inner or previous layer(s).

Similarly, the outer features 24 in the outer periodic structure 25 in quadrants I and III and the inner features 30, 32 in the inner periodic structures 23 positioned in quadrants I and III are oriented such that the long axis of the outer features 24 and the inner features 30, 32 extends in the Y-direction. There are also spaces (in the X-direction) between the inner features 30, 32 within each group 38 in each of the inner periodic structures 23 in quadrants I and III. As described more fully below, for each of the inner groups 38 and its corresponding outer feature 24 with which it has an end-to-end spacing relationship, the centerline-to-centerline spacing between each of the inner features 30, 32 and the corresponding outer features 24 in quadrants I and III determines the overlay error (if any) in the X-direction. The centerline-to-centerline spacing between the inner features 30, 32 within each of the groups 38 and their corresponding outer features 24 in quadrants I and III shown in FIG. 2 reflects the idealized (or perfect) overlay (in the X-direction) between the outer features 24 in the current layer as compared to the groups 38 of inner features 30, 32 in the inner or previous layer(s).

Accordingly, the inner periodic structures 23 (that includes the inner features 30, 32) and the outer periodic structures 25 (that include the outer features 24) are formed in different patterned layers of material such that the combined asymmetric AIM mark 20 contains information on the overlay accuracy of the two (or more) patterned layers of material with respect to the X- and Y-directions.

Figure 3:
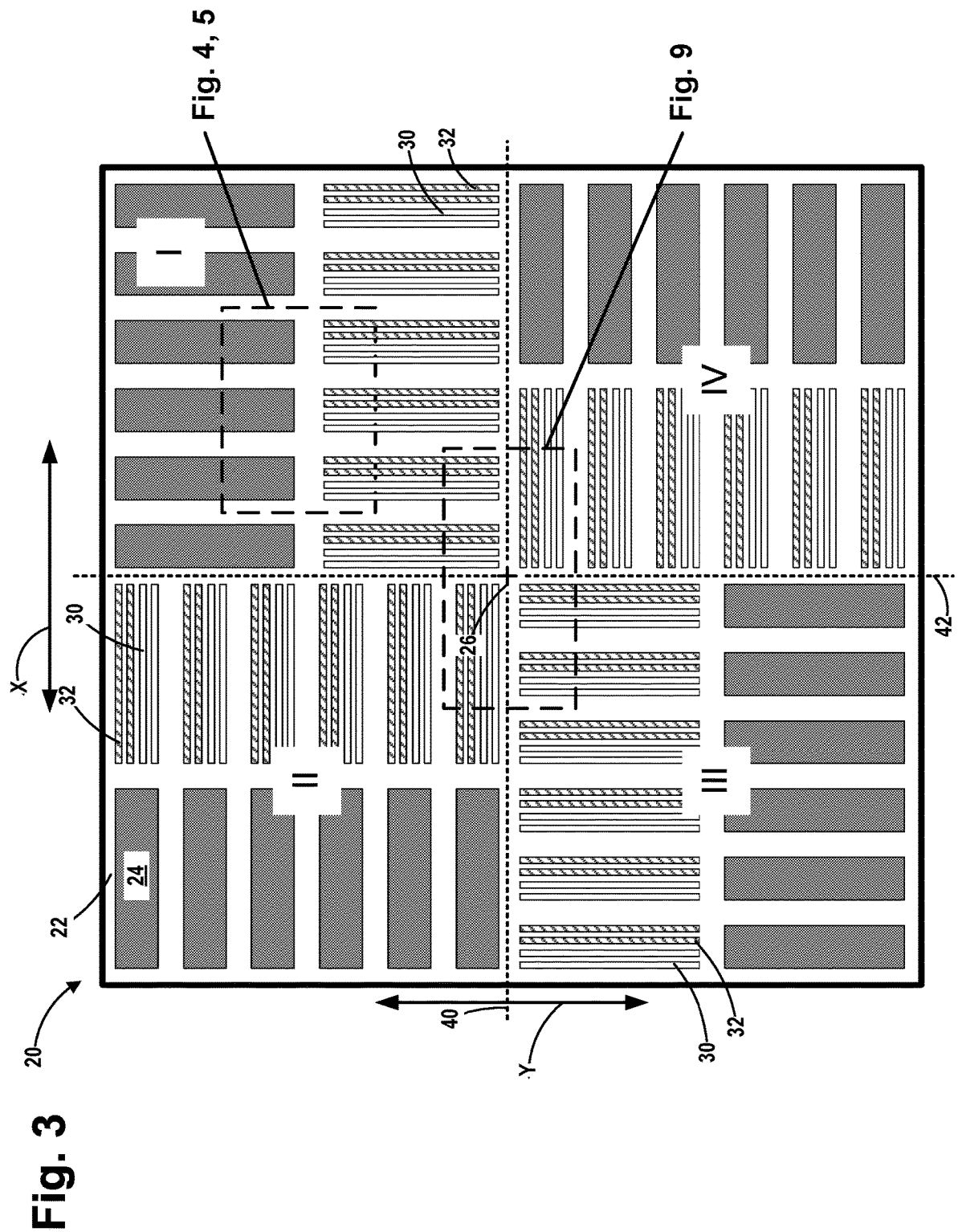
Figure 4:
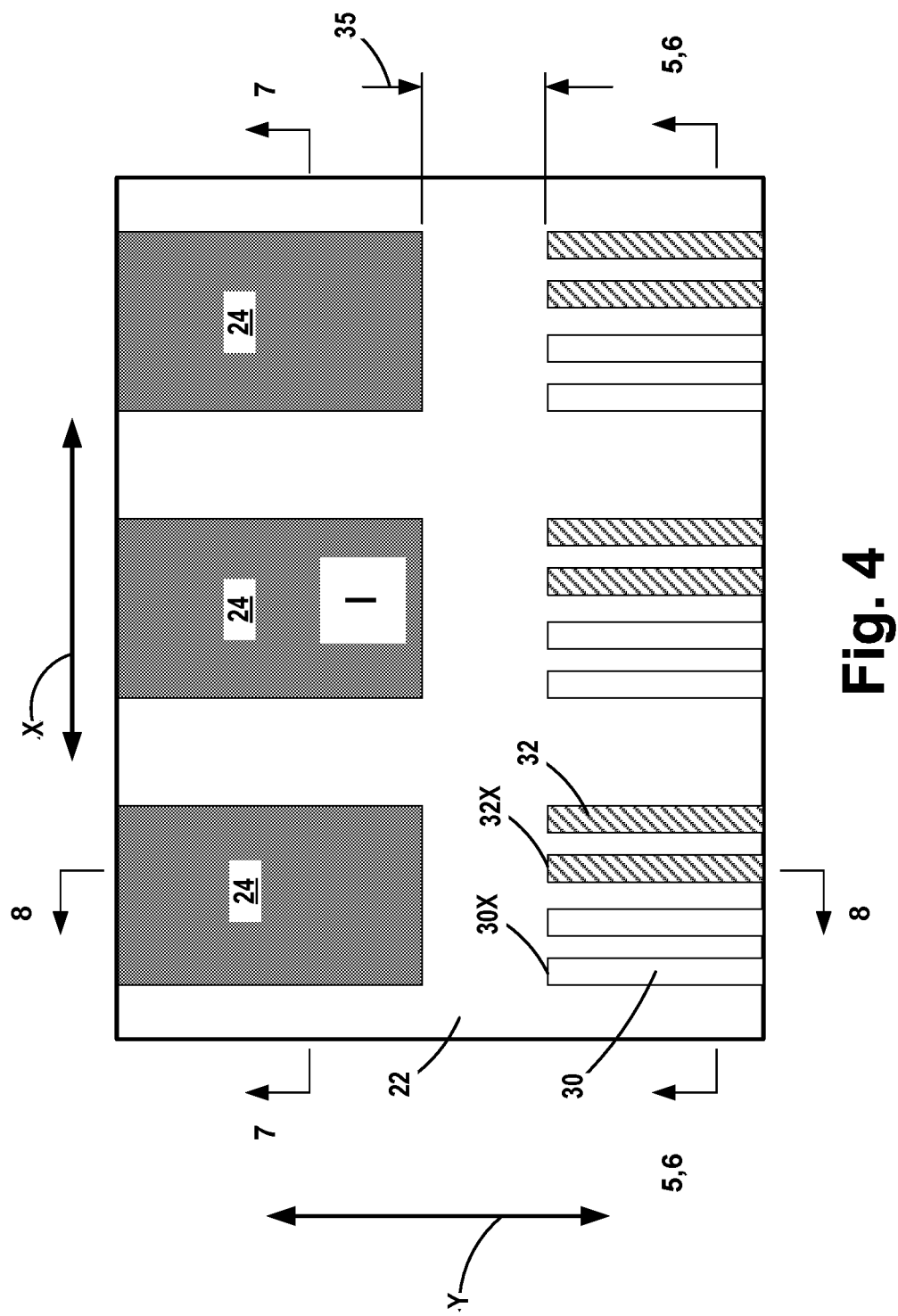
Figure 9:
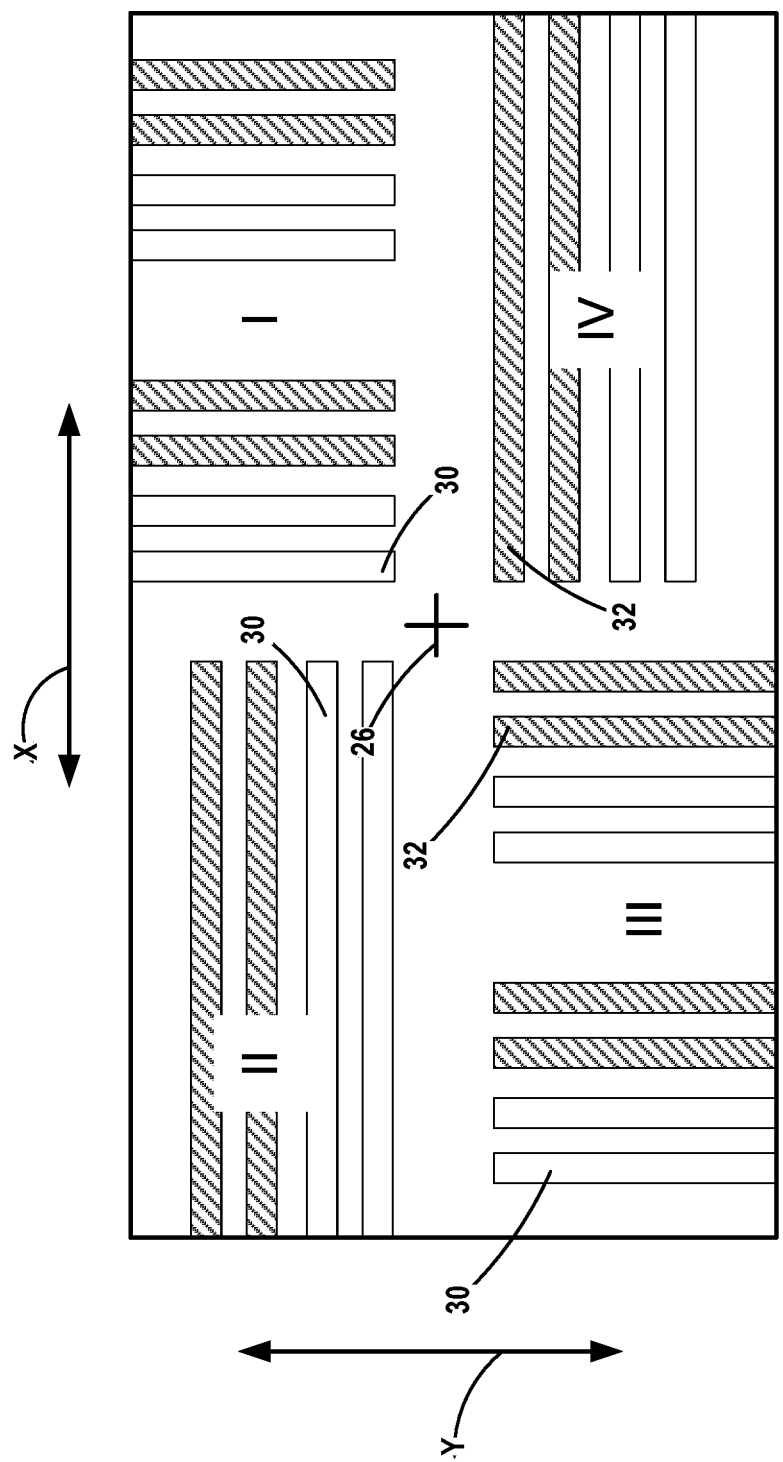

FIG. 3 is a plan view of one illustrative embodiment of an asymmetric AIM mark 20 disclosed herein. FIG. 3 indicates where various partial plan views (FIGS. 4, 5 and 9) of the asymmetric AIM mark 20 are taken. FIGS. 4 and 5 are enlarged views of different possible embodiments of the asymmetric AIM mark 20. FIG. 9 is an enlarged view of portions of each of the inner periodic structures 23 near the center 26 of the asymmetric AIM mark 20.

Figure 8:
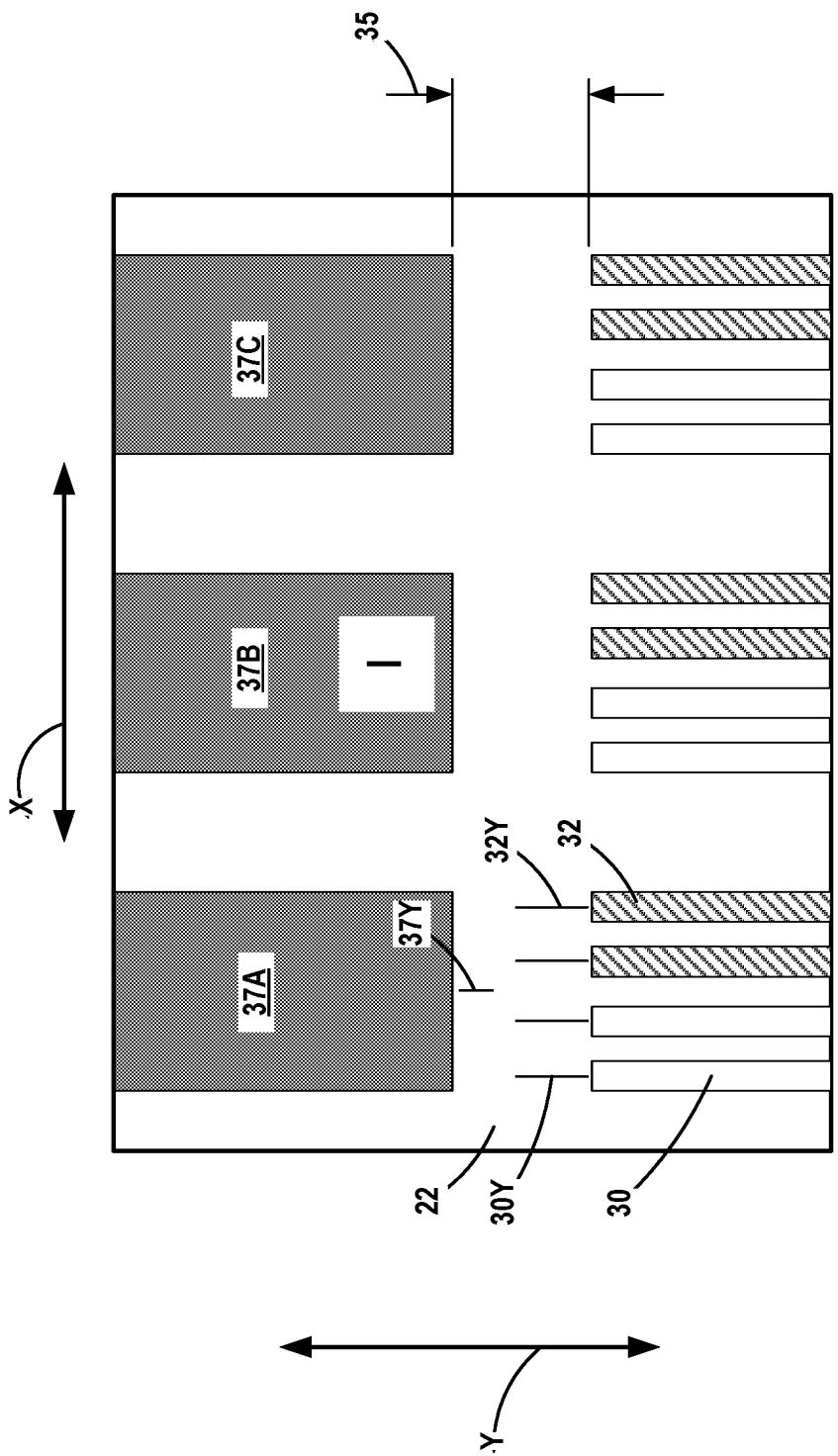

FIG. 4 is a partial plan view of a portion of one illustrative embodiment of a novel asymmetric AIM mark 20 disclosed herein. As shown in FIG. 4, FIGS. 5 and 6 are cross-sectional views of different illustrative embodiments of the asymmetric AIM mark 20 taken in the X-direction through the inner features 30, 32 of the inner periodic structure 23 in quadrant I; FIG. 7 is a cross-sectional view taken in the X-direction through the outer features 24 of the outer periodic structure 25 in quadrant I; and FIG. 8 is a cross-sectional view taken in the Y-direction through one of the outer features 24 of the outer periodic structure 25 and one of the inner features 32 of the inner periodic structure 23. FIGS. 4-8 depict the relationship between the inner features 30, 32 and the outer features 24 formed in quadrants I and III. This relationship will be the same for the inner features 30, 32 and the outer features 24 formed in quadrants II and IV, except that the views would be rotated 90 degrees.

FIG. 5 depicts one illustrative embodiment of an asymmetric AIM mark 20 disclosed herein wherein all of the plurality of inner features 30, 32 are formed in a single layer of material 70. More specifically, all of the patterned inner features 30, 32 are initially formed in a single layer of material by performing one or more etching processes through one or more patterned etch masks (not shown). For example, the inner features 30, 32 may be formed by forming a single patterned etch mask (not shown) above a physical layer of material (not shown) that will be patterned to form the inner features 30, 32, e.g., a layer of polysilicon that will eventually be patterned to form a plurality of polysilicon gate structures for transistor devices. The patterned etch mask may be formed using any of a variety of techniques, e.g., traditional single patterning techniques, double patterning techniques (e.g., LELE), multiple patterning techniques, etc. Thereafter, with the patterned etch mask in position, the inner features 30, 32 may be formed by performing one or more etching processes at the same time through the patterned etch mask. Then, the patterned etch mask may be removed and an insulating material 31, e.g., silicon dioxide, may be formed in the spaces between the inner features 30, 32 and a CMP process may be performed to remove excess amounts of the insulating material 31. With continuing reference to FIG. 5, at that point, a layer of material 24X—the current layer from which the outer features 24 will be formed—e.g., a layer of a conductive material or an insulating material, was formed across the entire substrate 22 and above all of the production die and all of the scribe lines on the substrate 22.

FIG. 6 is an alternative illustrative embodiment of an asymmetric AIM mark 20 disclosed herein wherein a plurality of the first inner features 30 are formed in the first layer of material 70, while a plurality of second inner features 32 are formed in a second layer of material 72 positioned above the first layer of material 70. Initially, the first layer of material 70 was blanket-deposited across the entire substrate 22 and above all of the production die and all of the scribe lines on the substrate 22. Then, a first patterned etch mask (not shown) was formed above the first layer of material 70. Next, the inner features 30 were formed in the single layer of material 70 by performing one or more etching processes through the first patterned etch mask. At that point, the first patterned etch mask was removed, an insulating material 31 was formed between the features 30 and a CMP process was performed to remove excess amounts of the material 31 positioned above the upper surface of the inner features 30. Thereafter, a second layer of material 72 from which the inner features 32 will be formed was blanket-deposited across the entire substrate 22 above the layer 70 (that includes the inner features 30). Next, a second patterned etch mask was formed above the second layer of material 72. Next, the second layer of material 72 was patterned to form the patterned inner features 32 by performing one or more etching processes through the second patterned etch mask. Then, the second patterned etch mask was removed, an insulating material 33, e.g., silicon dioxide, was deposited in the spaces between the inner features 32 in the second layer of material 72, and a CMP process was performed to remove excess amounts of the insulating material 33. As indicated in FIG. 6, at that point, the layer of material 24X (from which the outer features 24 will be formed), e.g., a layer of a conductive material or an insulating material, was formed across the entire substrate 22 above the second layer of material 72 that includes the inner features 32.

As will be appreciated by those skilled in the art after a complete reading of the present application, the inner features that are part of the inner periodic structures 23 may be formed in one or more layers of material. For example, in one embodiment described more fully below, each of the groups 38 within each inner periodic structure 23 may include four different inner features. In that situation, in one illustrative embodiment, each of these four inner features may all be formed in a single layer. In another example, each of these four inner features may be formed in its own layer of material, i.e., four separate layers of material, each of which have one of the inner features formed therein. In yet another example, two of the four inner features may be formed in a first layer, none of the inner features may be formed in a second layer positioned above the first layer, and the two remaining inner features may be formed in a third layer positioned above the second layer. Thus, the number of inner features (if any) of the inner periodic structures 23 that are formed in any particular physical layer or layers of material can vary depending upon the particular application.

FIGS. 7 and 8 depict the alternative arrangement shown in FIG. 6 wherein the plurality of the first inner features 30 are formed in the first layer of material 70, while the plurality of second inner features 32 are formed in a second layer of material 72. As with FIGS. 5 and 6, FIGS. 7 and 8 depict a point in processing where the layer of material 24X (the current layer from which the outer features 24 will be formed) was formed across the entire substrate 22 above the second layer of material 72 that includes the inner features 32, however, the layer of material 24X is not depicted in FIG. 8 so as not to overly complicate the drawings and to facilitate the disclosure of various concepts. As noted above, FIG. 7 is a cross-sectional view taken in the X-direction through the location where the outer features 24 of the outer periodic structure 25 in quadrant I will be formed in the layer of material 24X. Also depicted in FIG. 7 is a patterned etch mask 37, e.g., a patterned layer of photoresist, with three illustrative features 37A-C that correspond to the outer features 24 to be formed from the layer of material 24X by performing an etching process on the layer of material 24X through the patterned etch mask 37.

FIG. 8 is a plan view that does not include the layer of material 24X so as to facilitate explanation. As depicted, the patterned layer of photoresist 37 with the plurality of patterned photoresist features 37A-C were formed above the layer of material 24X. Prior to actually etching the layer of material 24X, the relative centerline spacing in the X-direction between the centerlines 37Y of the of the photoresist features 37A-C and centerlines 30Y and 32Y of the inner features 30, 32 will be determined. That is, for of each of the features 37A-C in the patterned masking layer 37, the centerline-to-centerline spacing between the centerline 37Y of the features in the patterned masking layer and the centerlines (30Y and 32Y) of each of the adjacent inner features 30, 32 formed in the inner periodic structures 23 is determined, typically by visual observation. If the centerline-to-centerline spacing or overlay between the centerlines of the various features 37A-C and the centerlines of the corresponding features 30, 32 is determined to be acceptable (e.g., based upon a pre-established criteria), the current layer of material, i.e., the layer of material 24X in this example, is etched using the patterned etch mask 37. If the centerline-to-centerline spacing or overlay between the centerlines of the various features is determined to be unacceptable, then the initial patterned etch mask 37 is removed. At that point, another patterned etch mask (not shown) is then formed above the layer of material 24X (that is to be patterned) and the centerline-to-centerline spacing or overlay (in the X direction) between the centerlines of the various features is again measured. This process is repeated until such time as the centerline-to-centerline spacing or overlay (in the X-direction) between the centerlines of the etch mask features in the latest patterned etch mask and the centerlines of the previously-formed inner features 30, 32 in the inner periodic structures 23 is determined to be acceptable. This process is repeated in the Y-direction with respect to the centerlines in the patterned features formed in the patterned layer of photoresist 37 and the centerlines of the adjacent inner features 30, 32 formed in the inner periodic structures 23. After the acceptability of the overlay between the features in the patterned layer of photoresist 37 and the previously formed inner features 30, 32 in the inner periodic structures, the layer of material 24X would then be etched by performing one or more etching processes through the latest patterned etch mask that exhibits acceptable overlay (in both the X and Y directions) with respect to the previously-formed inner features 30, 32.

FIG. 9 is an enlarged view of the central portion of one illustrative embodiment of an asymmetric AIM mark 20 disclosed herein wherein the inner periodic structures 23 includes two illustrative inner features —30 and 32—formed in one or more previous layers of material on the asymmetric AIM mark 20. This drawing again shows the asymmetric relationship between the features 30, 32 formed in quadrants II and IV as well as the asymmetric relationship between the inner features 30, 32 formed on quadrants I and III.

Figure 10:
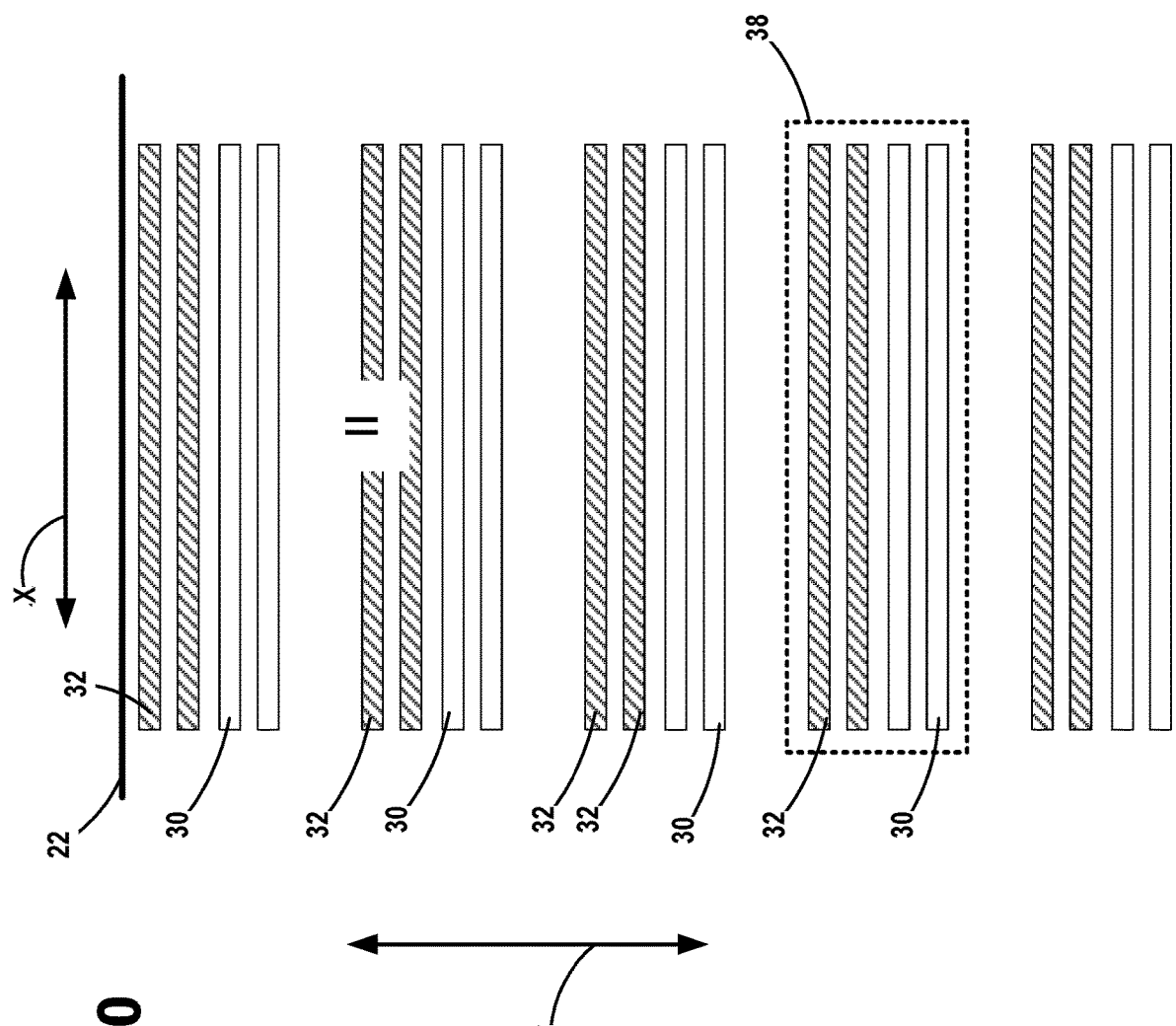

FIG. 10 is an enlarged view of a portion of one illustrative embodiment of an inner periodic structure 23 that includes a plurality of the groups 38 of inner features 30, 32. In this embodiment, each of the groups 38 include two of the inner features 30 and two of the inner features 32.

Figure 11:
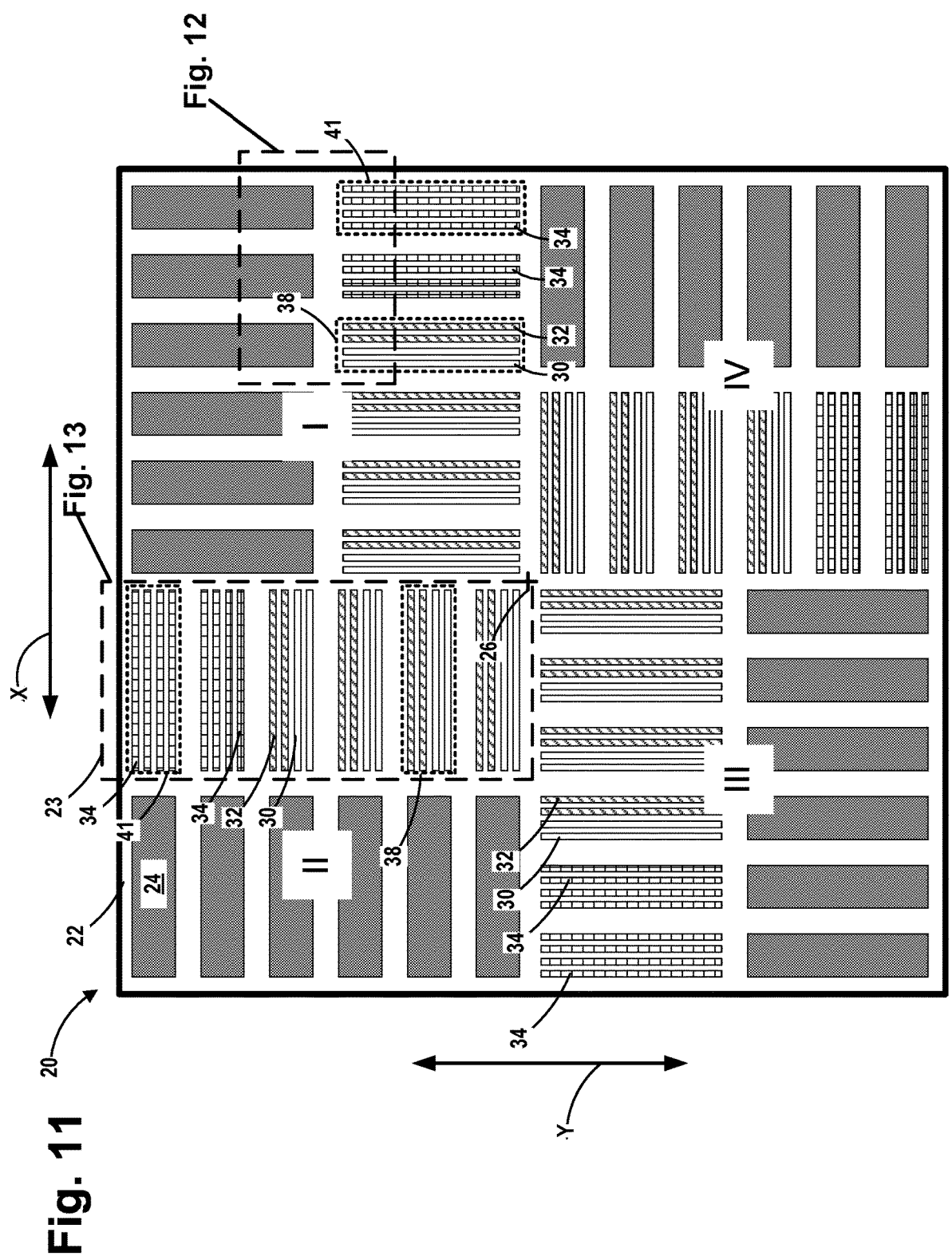
Figure 12:
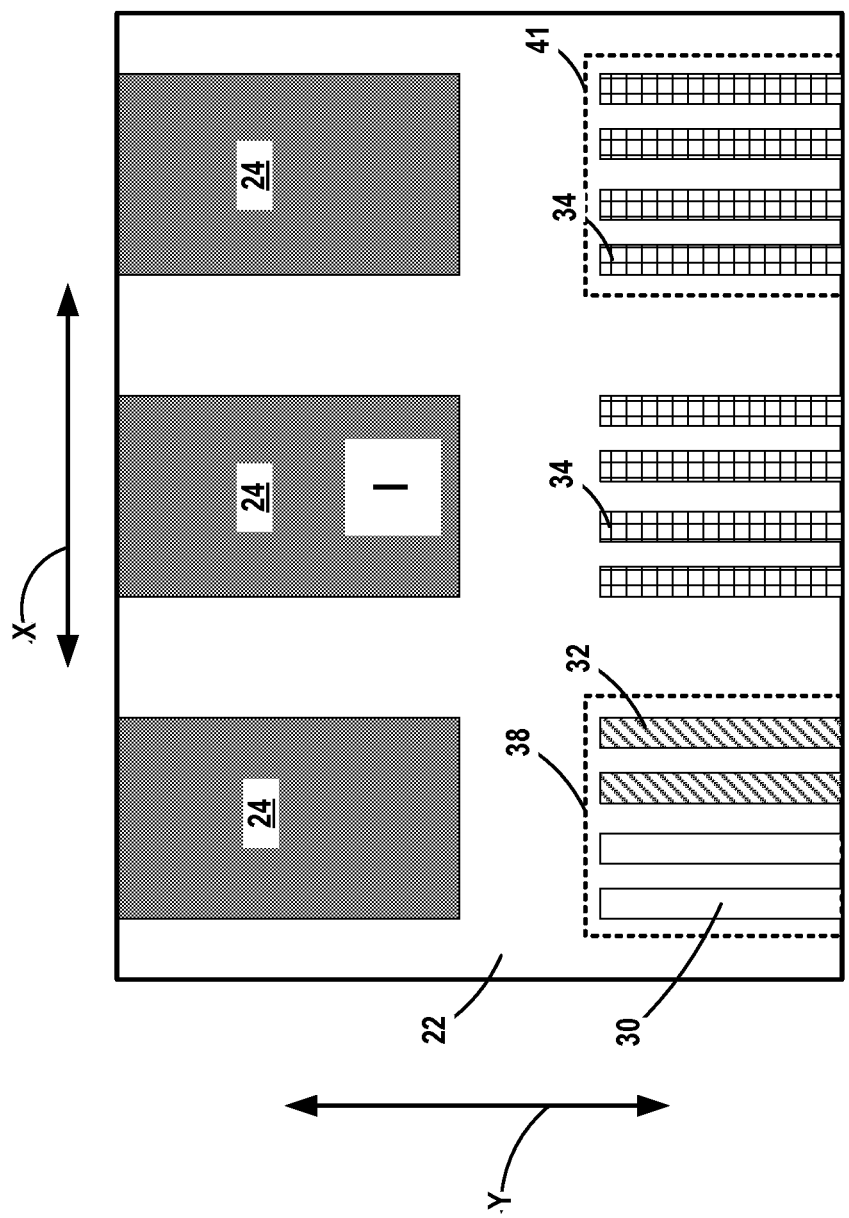
Figure 13:
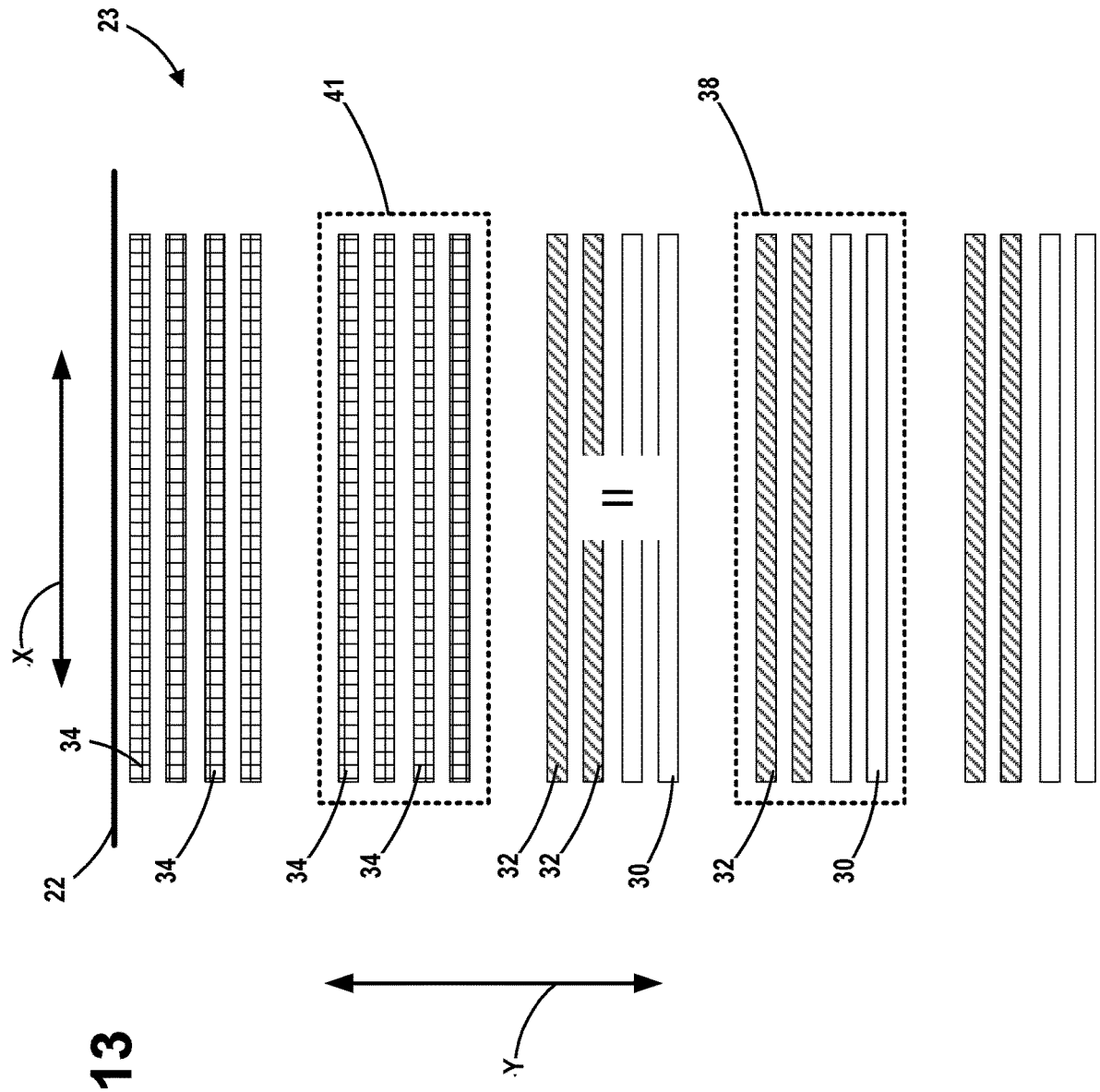

FIGS. 11, 12 and 13 depict another illustrative embodiment of an asymmetric AIM mark 20 disclosed herein. In this illustrative example, the inner periodic structures 23 includes three illustrative features: a plurality of first inner features 30, a plurality of second inner features 32 and a plurality of third inner features 34. Such an illustrative asymmetric AIM mark 20 may be used in a variety of processing applications such as, for example, a process involving a triple patterning process. In this illustrative example, each of the inner periodic structures 23 includes a plurality of first groups 38 of inner features and a plurality of second groups 41 of inner features. As before, each of the groups 38 includes two of the illustrative inner features 30 and two of the illustrative inner features 32. In this example, each of the groups 41 includes a plurality, e.g., four, of only the illustrative inner features 34. The inner features 34 may be the same or different types of features as compared to one or both of the inner features 30, 32 formed in the groups 38. The number of groups 38, 41 in each of the inner periodic structures 23 may vary depending upon the particular application. In the example shown in FIG. 11, each of the inner periodic structures 23 includes four of the groups 38 and two of the groups 41. FIG. 11 indicates where various partial plan views (FIGS. 12 and 13) of the asymmetric AIM mark 20 shown in FIG. 11 are taken. FIG. 12 is a partial plan view that depicts the relationship between the inner features 30, 32 and 34 that were previously formed in the inner or previous layer on the asymmetrical mark 20 as well as the outer features 24 that were formed in quadrants I and III. This relationship will be the same for the inner features 30, 32, 34 and the outer features 24 formed in quadrants II and IV, except that the views would be rotated 90 degrees.

FIG. 13 is an enlarged view of a portion of one illustrative embodiment of an inner periodic structure 23 disclosed herein. As noted above, each of the inner periodic structures 23 includes a plurality of groups 38 of inner features and a plurality of groups 41 of inner features. The groups 38 include two of the illustrative inner features 30 and two of the illustrative inner features 32, while each of the groups 41 include four of the illustrative inner features 34.

Figure 14:
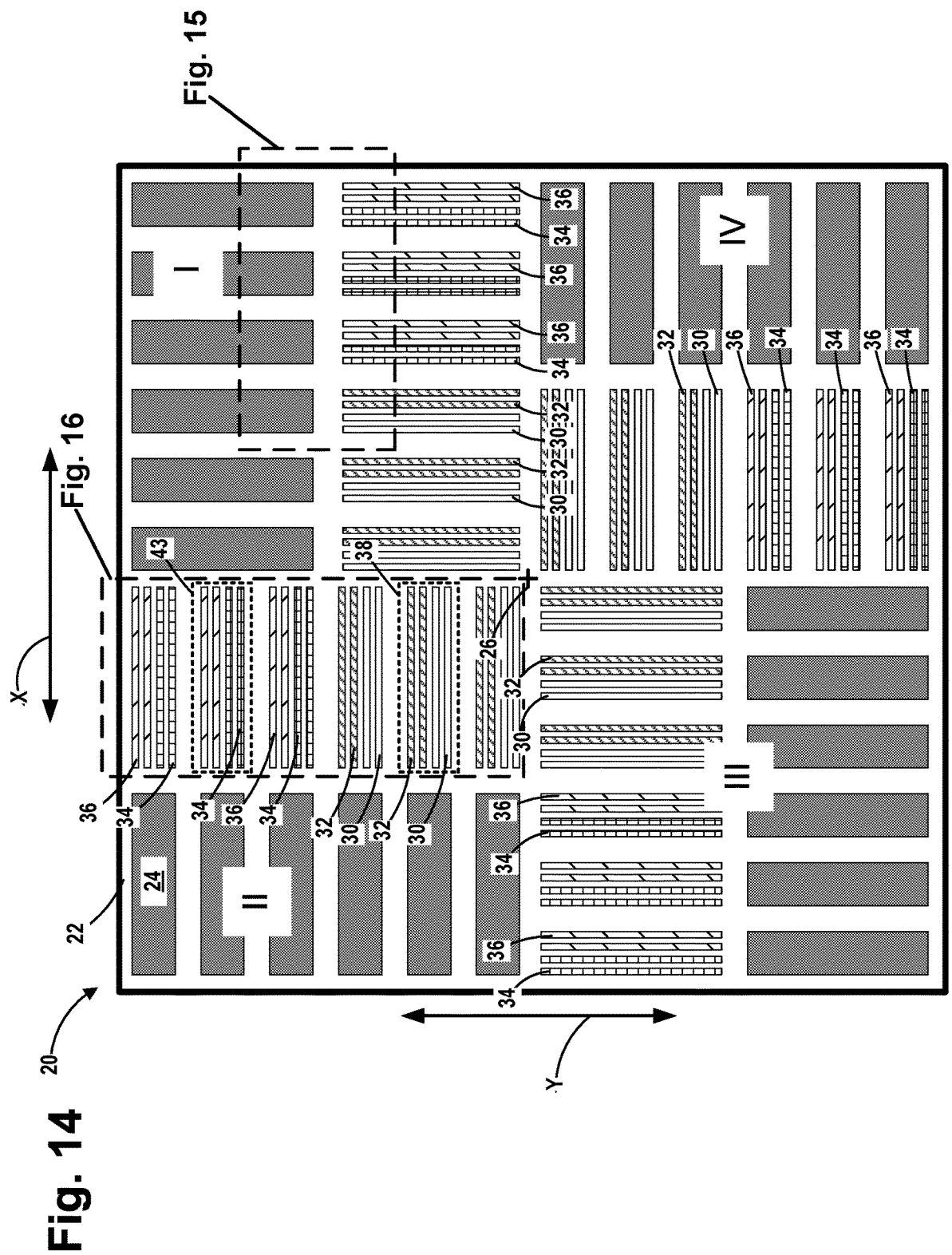
Figure 15:
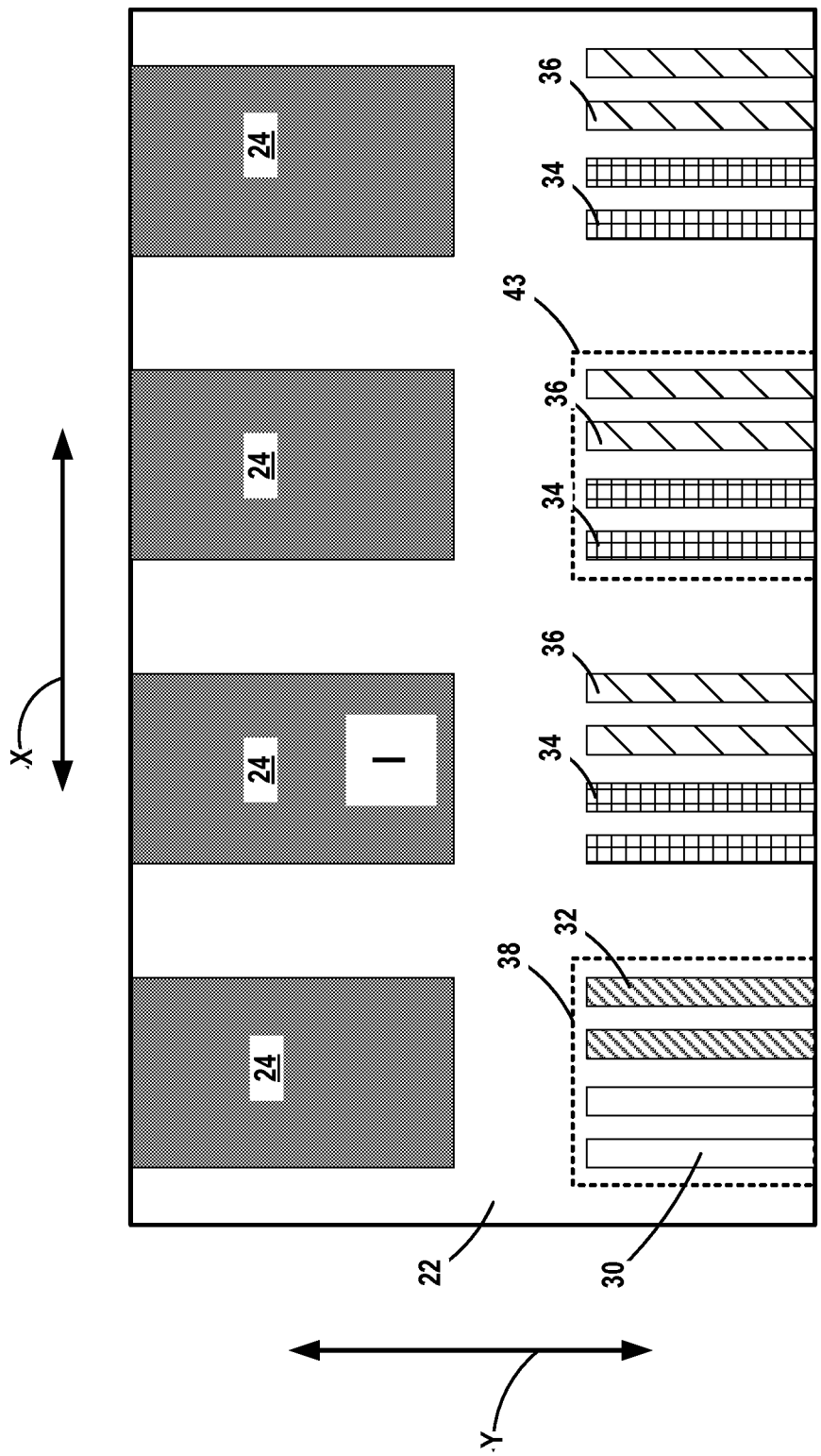
Figure 16:
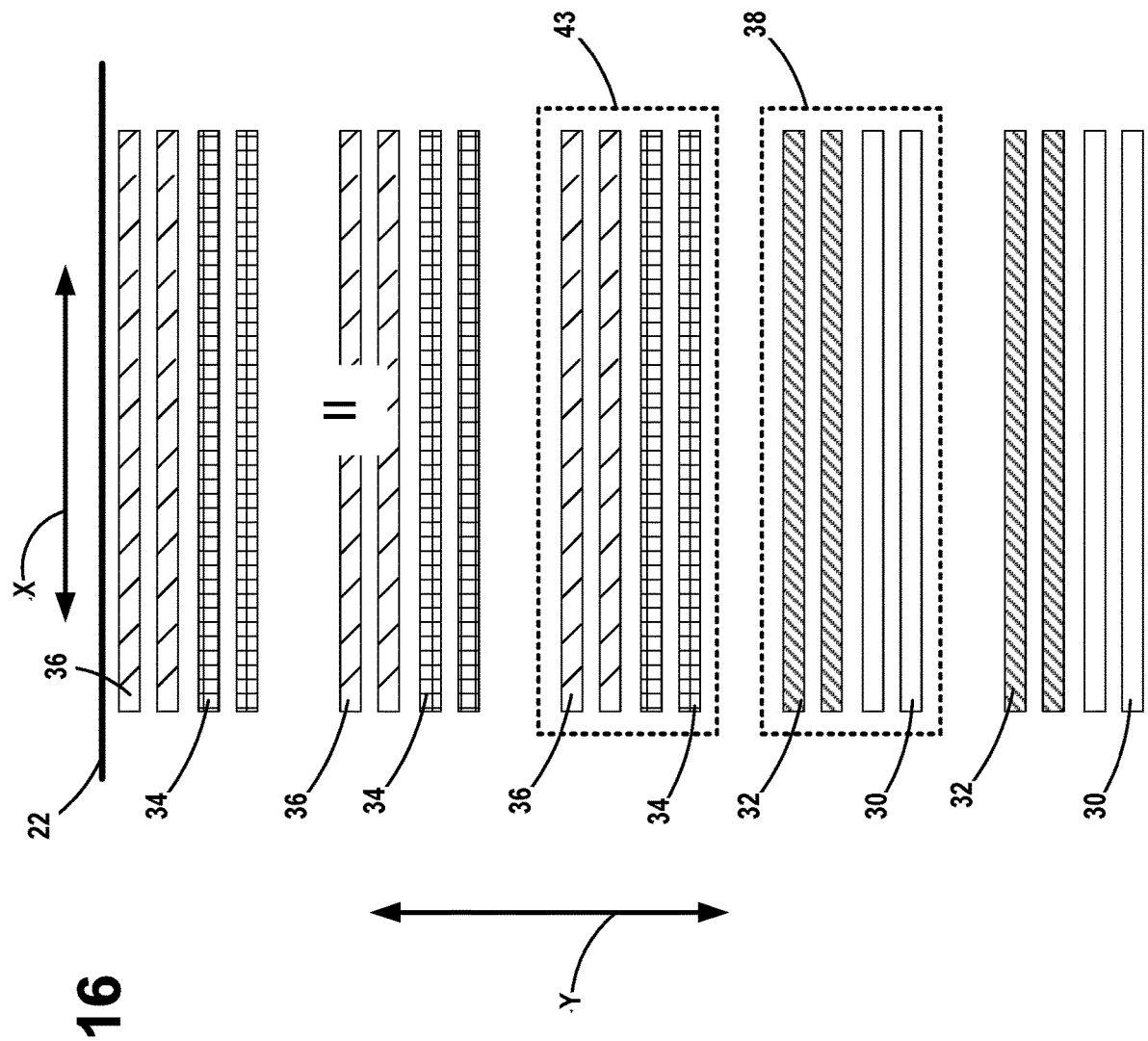

FIGS. 14, 15 and 16 depict another illustrative embodiment of an asymmetric AIM mark 20 disclosed herein. In this illustrative example, the inner periodic structures 23 include four illustrative features: a plurality of first inner features 30, a plurality of second inner features 32, a plurality of third inner features 34 and a plurality of fourth inner features 36. Such an illustrative asymmetric AIM mark 20 may be used in a variety of processing applications such as, for example, a process involving a quadruple patterning process. In this illustrative example, each of the inner periodic structures 23 includes three illustrative groups 38 of inner features and three illustrative groups 43 of inner features. As before, each of the groups 38 includes two of the illustrative inner features 30 and two of the illustrative inner features 32. In this example, each of the groups 43 include two of the third inner features 34 and two of the fourth inner features 36. The inner features 36 may be the same or different types of features as compared to any of the inner features 30, 32, 34 described above. The number of groups 38, 43 of inner features in each of the inner periodic structures 23 may vary depending upon the particular application. In the depicted example, each of the inner periodic structures 23 includes three of the groups 38 and three of the groups 43.

FIG. 14 indicates where various partial plan views (FIGS. 15 and 16) of the asymmetric AIM mark 20 shown in FIG. 14 are taken. FIG. 15 is a partial plan view that depicts the relationship between the inner features 30, 32, 34 and 36 that were previously formed in the inner or previous layer on the asymmetrical mark 20 as well as the outer features 24 that were formed in quadrants I and III. This relationship will be the same for the inner features 30, 32, 34, 36 and the outer features 24 formed in quadrants II and IV, except that the views would be rotated 90 degrees.

FIG. 16 is an enlarged view of a portion of one illustrative embodiment of an inner periodic structure 23 disclosed herein. As noted above, each of the inner periodic structures 23 includes a plurality of groups 38 of inner features and a plurality of groups 43 of inner features. The groups 38 include two of the illustrative inner features 30 and two of the illustrative inner features 32, while each of the groups 43 include two of the third inner features 34 and two of the fourth inner features 36.

Figure 17:
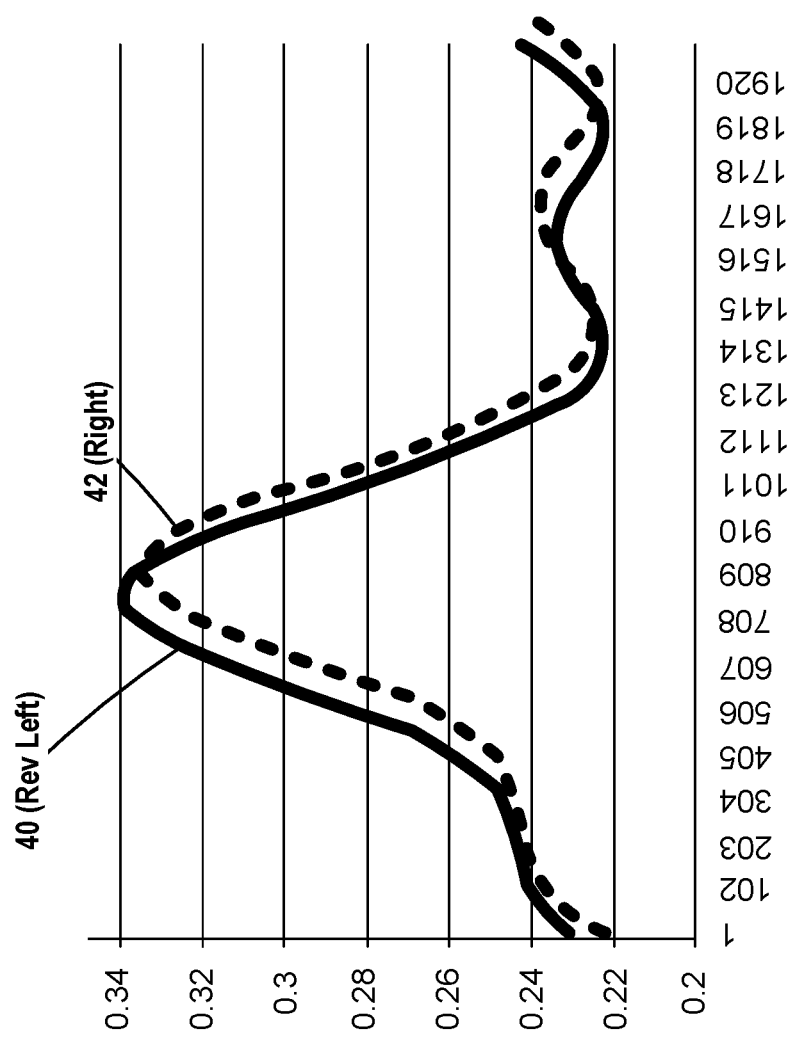
Figure 18:
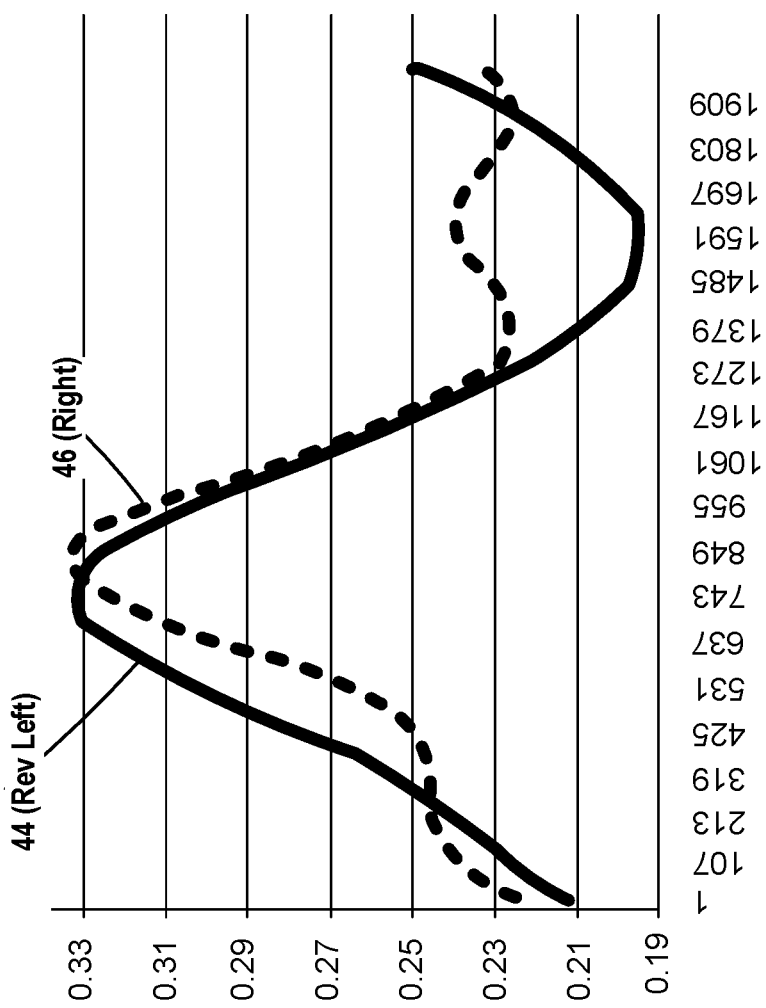
FIG. 18 depicts aspects and features of prior art symmetric AIM overlay marks.

One benefit of using the asymmetric AIM marks 20 disclosed herein is that the overlay measurement will be less noisy as compared to overlay measurement performed using prior art AIM marks 10 that have a symmetric design, like the one shown in FIG. 1. FIG. 17 is a graph depicting a simulation of wave shapes resulting from overlay measurement of the illustrative embodiment of the asymmetric AIM mark 20 shown in FIG. 2, i.e., the embodiment wherein each group 38 includes two of the inner features 30 and two of the inner features 32. FIG. 18 is a similar graph reflecting an overlay measurement process performed using a symmetrical prior art AIM mark 10, like the one shown in FIG. 1. In FIGS. 17 and 18, the horizontal axis represents the location (or coordinate) of the inner features as well as the etch mask features in a patterned etch mask prior to performing an etching process through the patterned etch mask, while the vertical axis represents aerial image intensity. As will be recognized by those skilled in the art, the plots 40 and 42 in FIG. 17 are, respectively, "reverse left" and "right" plots that are used to determine or calculate overlay. Similarly, the plots 44 and 46 in FIG. 17 are, respectively, "reverse left" and "right" plots. With reference to FIG. 17, the reverse left plot 40 and the right plot 42 when using the asymmetric AIM mark 20 disclosed herein have basically the same configuration. This similarity between the "reverse left" and "right" plot is in contrast to the dissimilar nature of the "reverse left" plot 44 and the "right" plot 46 shown in FIG. 18 when using a prior art symmetrical arranged AIM mark. Thus, when using the asymmetric AIM marks 20 disclosed herein, when a certain overlay shift has occurred in a first direction (e.g., the Y direction), the groups 38, 41, 43 (as the case may be—that include the various features, e.g., 30, 32, 34, 36 in different embodiments) located in quadrants II and IV (on opposite sides of the X-centerline 40) will detect any shift in the Y-direction and provide consistent measurement given the similarity of the wave shapes 40, 42 using the asymmetric marks 20 disclosed herein. Similarly, when using the asymmetric AIM marks 20 disclosed herein, when a certain overlay shift has occurred in the X direction (orthogonal to the Y direction), the groups 38, 41, 43 (as the case may be—that include the various features, e.g., 30, 32, 34, 36 in different embodiments) located in quadrants I and III (on opposite sides of the Y-centerline 42 will detect the shift in the X-direction.

FIGS. 19 and 20 provide an example as to how the novel asymmetric marks 20 may be used to compensate for CD (critical dimension) errors in various production features. In one embodiment, this is accomplished by using an edge placement strategy (as shown in FIG. 20) for aligning the features as compared to focusing on a center aligned strategy (as shown in FIG. 19) for the features. In this example, the use of an illustrative embodiment of an asymmetric AIM mark 20 that includes two illustrative inner features 30, 32 (see FIG. 2) will be discussed.

The upper portion of FIG. 19 depicts the previously formed inner features 30 and 32 (in the inner layer) as well as an outer feature 54 that is to be formed in the current layer after proper alignment of the photoresist feature in a patterned etch mask (not shown) that corresponds to the outer feature 54 relative to the previously-formed inner features 30, 32 is confirmed. The features are formed on target centerlines 51 and all of the features 30, 32 and 54 are formed to target CD dimension. The ideal CD for inner feature 32 is 32A. In such a situation, the features have a target edge-to-edge spacing 53. The lower portion of FIG. 19 depicts the situation where the inner feature 32 is formed with a CD 32Y that is greater than the target CD 32A for the inner feature 32. As a result, the edge-to-edge spacing between the inner feature 32 and the outer feature 54 is now 53X, a dimension that is less than the target edge-to-edge spacing 53 between such features.

In contrast, FIG. 20 depicts the situation where an edge placement strategy is used to align the features as opposed to the above-described center align strategy. As before, the upper portion of FIG. 20 depicts the previously formed inner features 30 and 32 as well the feature 54 that is to be formed in the current layer after proper alignment of the photoresist feature in a patterned etch mask (not shown) that corresponds to the outer feature 54 relative to the features 30, 32 is confirmed. The upper portion of FIG. 20 depicts the features as formed on target centerlines 51, wherein all of the features 30, 32 and 54 are formed to their respective target CD dimension. The ideal CD for inner feature 32 is 32A. In such a situation, the features have a target edge-to-edge spacing 53. The lower portion of FIG. 20 depicts the situation where the inner feature 32 is formed with a CD 32Y that is greater than the target CD 32A for the inner feature 32. The dashed line position of the outer feature 54 reflects the location where the outer feature 54 will be formed using a center aligned strategy. As before, due to the increased CD 32Y of the inner feature 32, use of a center aligned approach would result in an unacceptable edge-to-edge spacing 53X between the outer feature 54 and inner feature 32. However, using the novel edge placement strategy disclosed herein, the outer feature 54 (indicated in solid lines) is essentially shifted to the left in FIG. 20. This results in an edge-to-edge spacing 53Y that is less than the target edge-to-edge spacing 53 but still acceptable. Note that the edge-to-edge spacing 53Y is larger than the unacceptable edge-to-edge spacing 53X that resulted when using a center aligned strategy. Additionally, the edge-to-edge spacing 55 is also less than the target edge-to-edge spacing 53, but still within process limits. As a result, the edge-to-edge spacing between the inner feature 32 and the outer feature 54 is now 53X, a dimension that is less than the target edge-to-edge spacing 53 between such features.

As will be appreciated by those skilled in the art after a complete reading of the present application there are several novel inventions disclosed herein. One illustrative example of an overlay mark disclosed herein includes four quadrants (I-IV) and a first centerline 40 that extends in a first direction, wherein quadrants I and II, considered collectively, and quadrants III and IV, considered collectively, are positioned on opposite sides of the first centerline 40 and a second centerline 42 that extends in a second direction that is orthogonal to the first direction, wherein quadrants I and IV, considered collectively, and quadrants II and III, considered collectively, are positioned on opposite sides of the second centerline 42. In this example, the overlay mark also includes an inner periodic structure 23 and an outer periodic structure 25 formed in each of the four quadrants, wherein the outer periodic structure 25 includes a plurality of outer features 24, wherein the inner periodic structure 23 includes a plurality of first inner groups 38, each of the first inner groups 38 including a plurality of first inner features 30, each first inner group 38 being oriented such that there is an end-to-end spacing relationship between each first inner group 38 and a selected one of the outer features 24.

In other embodiments, the inner periodic structures 23 in quadrants II and IV are positioned asymmetrically relative to the first centerline 40 and to a center 26 of the overlay mark, and the inner periodic structures 23 in quadrants I and III are positioned asymmetrically relative to the second centerline 42 and to the center 26 of the overlay mark.

In yet other embodiments, an overlay mark disclosed herein includes four quadrants (I-IV), a first centerline 40 that extends in a first direction, wherein quadrants I and II, considered collectively, and quadrants III and IV, considered collectively, are positioned on opposite sides of the first centerline 40 and a second centerline 42 that extends in a second direction that is orthogonal to the first direction, wherein quadrants I and IV, considered collectively, and quadrants II and III, considered collectively, are positioned on opposite sides of the second centerline 42. In this example, the mark further includes an inner periodic structure 23 and an outer periodic structure 25 formed in each of the four quadrants, wherein the outer periodic structure 25 includes a plurality of outer features 24, wherein the inner periodic structure 23 includes a plurality of first inner groups 38, each of the first inner groups 38 including a plurality of first inner features 30 and wherein the inner periodic structures 23 in quadrants II and IV are positioned asymmetrically relative to the first centerline 40 of the overlay mark, and the inner periodic structures 23 in quadrants I and III are positioned asymmetrically relative to the second centerline 42 of the overlay mark.

In further embodiments of the overlay mark, the inner periodic structures 23 in quadrants II and IV are non-mirror images of one another relative to the first centerline 40 (when rotated about the centerline 40 and juxtaposed opposite one another) and the inner periodic structures 23 in quadrants I and III are non-mirror images of one another relative to the second centerline 42 (when rotated about the centerline 42 and juxtaposed opposite one another).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An overlay mark comprising four quadrants referenced with numerals I, II, III and IV respectively, said overlay mark comprising:
   a first centerline that extends in a first direction, wherein quadrants I and II, considered collectively, and quadrants III and IV, considered collectively, are positioned on opposite sides of said first centerline;
   a second center line that extends in a second direction that is orthogonal to said first direction, wherein quadrants I and IV, considered collectively, and quadrants II and III, considered collectively, are positioned on opposite sides of said second centerline; and
   four inner periodic structures and four outer periodic structures,
   wherein each of said four quadrants includes one of the four inner periodic structures and one of the four outer periodic structures, and wherein each of said outer periodic structures comprises a plurality of outer features, wherein each of said inner periodic structures comprises a plurality of first inner groups, each of said first inner groups comprising a plurality of first inner features, each of said first inner groups being oriented such that there is an end-to-end spacing relationship between each of said first inner groups and one of said outer features.

2. The overlay mark of claim 1, wherein each of said plurality of first inner groups further comprises a plurality of second inner features.

3. The overlay mark of claim 2, wherein said plurality of first inner features is representative of a plurality of first structures formed in a production die and said plurality of second inner features is representative of a plurality of second structures formed in said production die.

4. The overlay mark of claim 3, wherein said plurality of first structures and said plurality of second structures are a same type of structure.

5. The overlay mark of claim 2, wherein said plurality of first inner features is positioned in a first layer and said plurality of second inner features is positioned in a second layer that is positioned above said first layer.

6. The overlay mark of claim 2, wherein said plurality of first inner features and said plurality of second inner features are formed at substantially the same time.

7. The overlay mark of 1, wherein said inner periodic structures in quadrants II and IV are positioned asymmetrically relative to said first centerline and to a center of said overlay mark, and said inner periodic structures in quadrants I and III are positioned asymmetrically relative to said second centerline and to said center of said overlay mark.

8. The overlay mark of claim 1, wherein each of said inner periodic structures further comprises a plurality of second inner groups, each of said second inner groups comprising a plurality of third inner features, each of said second inner groups being oriented such that there is an end-to-end spacing relationship between each of said second inner groups and one of said outer features.

9. The overlay mark of claim 8, wherein each of said plurality of second inner groups further comprises a plurality of fourth inner features.

10. The overlay mark of claim 8, wherein said plurality of third inner features is representative of a plurality of third structures formed in a production die, wherein said third structures are different types of structures as compared to said first and second structures and wherein said first inner features are formed in a first layer, said second inner features are formed in a second layer positioned above said first layer and said third inner features are formed in a third layer positioned above said second layer.

11. The overlay mark of claim 8, wherein said plurality of third inner features is representative of a plurality of third structures formed in a production die, wherein said third structures are a same type of structure as compared to said first and second structures.

12. The overlay mark of claim 8, wherein said plurality of second inner features and said plurality of third inner features are formed at substantially the same time.

13. An overlay mark comprising four quadrants that will be referenced with numerals I, II, III and IV respectively, said overlay mark comprising:
   a first centerline that extends in a first direction, wherein quadrants I and II, considered collectively, and quadrants III and IV, considered collectively, are positioned on opposite sides of said first centerline;
   a second centerline that extends in a second direction that is orthogonal to said first direction, wherein quadrants I and IV, considered collectively, and quadrants II and III, considered collectively, are positioned on opposite sides of said second centerline; and
   four inner periodic structures and four outer periodic structures, wherein each of said four quadrants includes one of the four inner periodic structures and one of the four outer periodic structures, and wherein each of said outer periodic structures comprises a plurality of outer features, wherein each of said inner periodic structures comprises a plurality of first inner groups, each of said first inner groups comprising a plurality of first inner features and wherein said inner periodic structures in quadrants II and IV are positioned asymmetrically relative to said first centerline of said overlay mark, and said inner periodic structures in quadrants I and III are positioned asymmetrically relative to said second centerline of said overlay mark.

14. The overlay mark of claim 13, wherein said inner periodic structures in quadrants II and IV are non-mirror images of one another relative to said first centerline and said inner periodic structures in quadrants I and III are non-mirror images of one another relative to said second centerline.

15. The overlay mark of claim 14, wherein each of said first inner groups is oriented such that there is an end-to-end spacing relationship between each of said first inner groups and one of said outer features.

16. The overlay mark of claim 13, wherein said plurality of first inner groups further comprises a plurality of second inner features.

17. The overlay mark of claim 16, wherein said inner periodic structure further comprises a plurality of second inner groups, each of said second inner groups comprising a plurality of third inner features, each of said second inner groups being oriented such that there is an end-to-end spacing relationship between each of said second inner groups and one of said outer features.

18. The overlay mark of claim 17, wherein each of said plurality of second inner groups further comprises a plurality of fourth inner features.

19. The overlay mark of claim 17, wherein said plurality of third inner features are formed after the formation of said plurality of first inner features and after the formation of said plurality of second inner features.

\* \* \* \* \*